United States Patent
Bencher

(10) Patent No.: US 10,012,910 B2
(45) Date of Patent: Jul. 3, 2018

(54) PATTERN GENERATORS EMPLOYING PROCESSORS TO VARY DELIVERY DOSE OF WRITING BEAMS ACCORDING TO PHOTORESIST THICKNESS, AND ASSOCIATED METHODS

(71) Applicant: Applied Materials, Inc., Santa Clara, CA (US)

(72) Inventor: Christopher Dennis Bencher, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/026,717

(22) PCT Filed: Jun. 19, 2014

(86) PCT No.: PCT/US2014/043223
§ 371 (c)(1),
(2) Date: Apr. 1, 2016

(87) PCT Pub. No.: WO2015/060905
PCT Pub. Date: Apr. 30, 2015

(65) Prior Publication Data
US 2016/0216615 A1 Jul. 28, 2016

Related U.S. Application Data

(60) Provisional application No. 61/894,331, filed on Oct. 22, 2013, provisional application No. 61/982,306, filed on Apr. 21, 2014.

(51) Int. Cl.
G03B 27/42 (2006.01)
G03F 7/20 (2006.01)

(52) U.S. Cl.
CPC .......... *G03F 7/70558* (2013.01); *G03F 7/702* (2013.01); *G03F 7/70383* (2013.01); *G03F 7/70608* (2013.01)

(58) Field of Classification Search
CPC .... G03F 7/702; G03F 7/2022; G03F 7/70075; G03F 7/70116; G03F 7/70558;
(Continued)

(56) References Cited

U.S. PATENT DOCUMENTS

| 7,919,218 | B2 | 4/2011 | Sjostrom | |
|---|---|---|---|---|
| 2008/0304034 | A1* | 12/2008 | Ockwell | G03F 7/70291 355/67 |
| 2010/0099051 | A1 | 4/2010 | Sandstrom et al. | |

FOREIGN PATENT DOCUMENTS

| JP | 09-185814 A | 7/1997 |
|---|---|---|
| WO | 02/01298 A1 | 1/2002 |
| WO | 2010/092128 A1 | 8/2010 |

OTHER PUBLICATIONS

International Search Report and Written Opinion, PCT/US2014/043223, dated Oct. 31, 2014.

* cited by examiner

*Primary Examiner* — Mesfin Asfaw
(74) *Attorney, Agent, or Firm* — Patterson + Sheridan LLP

(57) ABSTRACT

Multi-beam pattern generators employing processors to vary delivered dose of writing beams according to photoresist thicknesses, and associated methods are disclosed. A pattern generator may write a pattern upon a substrate having a photoresist which is sensitive to the writing beams. The pattern may be written in respective writing cycles when the writing beams write at least a portion of the pattern at writing pixel locations. A beam actuator of the pattern generator may independently direct the writing beams to the
(Continued)

writing pixels to deliver respective pixel doses during each writing cycle. Pixel doses delivered may be adjusted according to a thickness of the photoresist at various writing pixel locations according to one or more approaches, using one or more of: actuator dwell times, emitted pulse duration, emitted pulse frequency, and emitted pulse intensity. In this manner, additional dimensional control is provided for substrates having variable photoresist thicknesses.

15 Claims, 22 Drawing Sheets

(58) Field of Classification Search
CPC . G03F 7/20; G03F 7/2004; G03F 7/40; G03F 7/0035; G03F 7/70191; G03F 7/70308; G03F 7/0007; G03F 7/70091; G03F 7/095; G03F 7/26; G03F 1/44; G03F 7/039; G03F 7/094; G03F 7/70
See application file for complete search history.

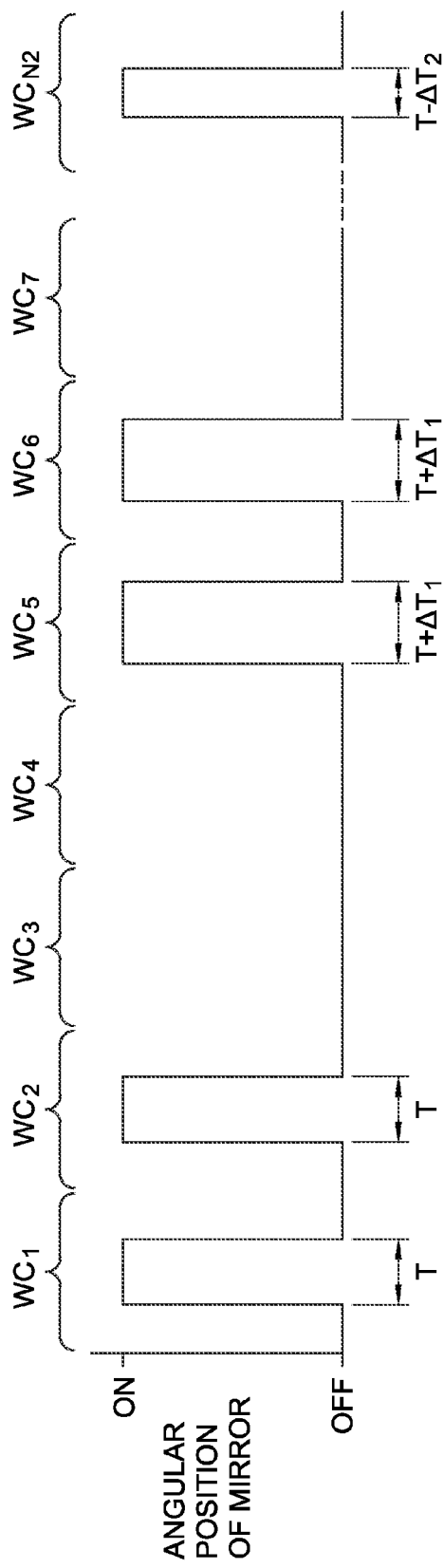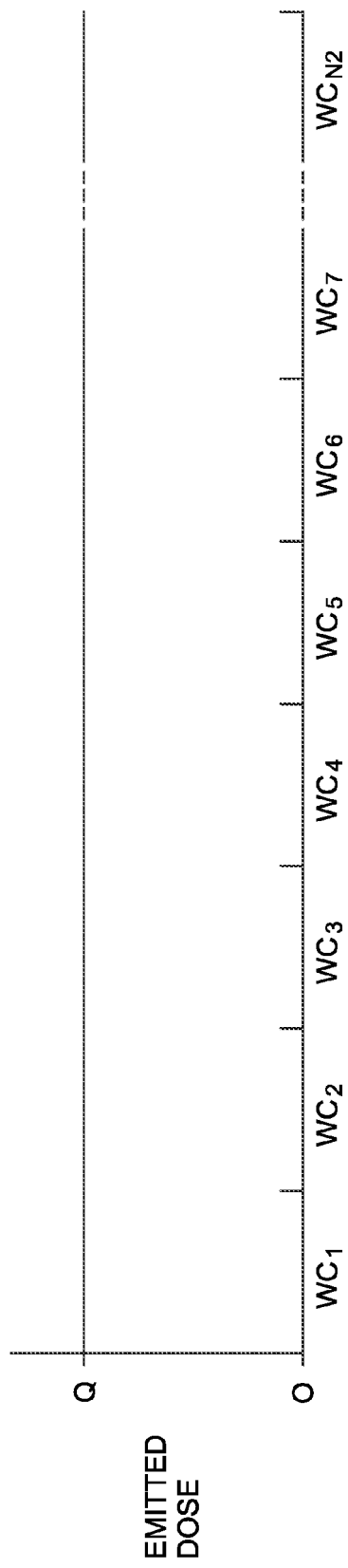

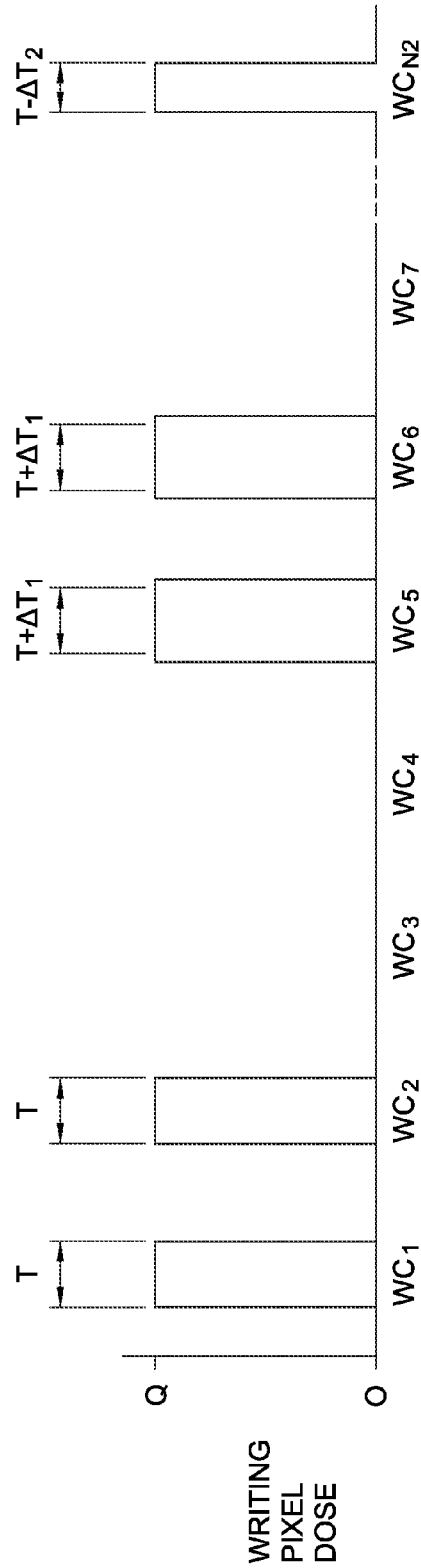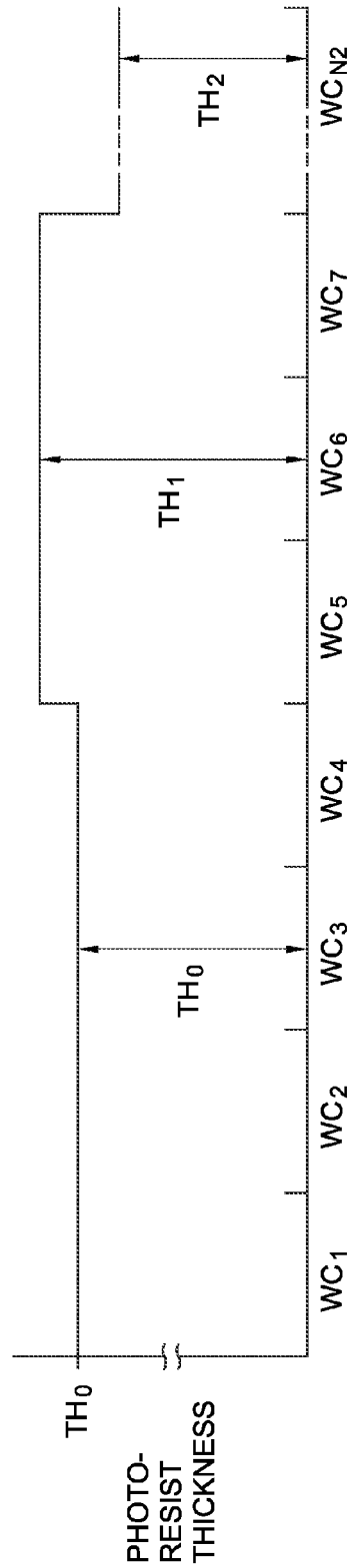
Fig. 6C
Fig. 6D

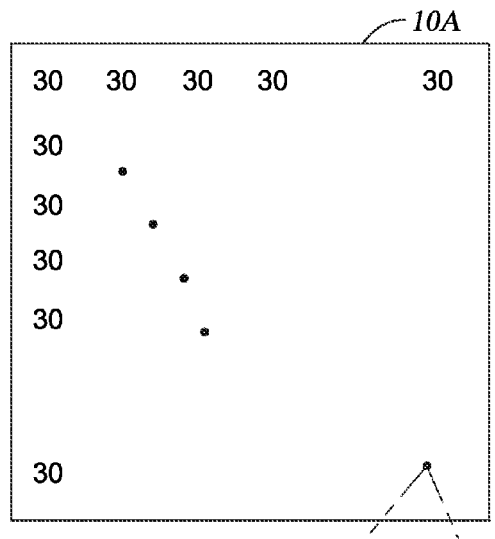
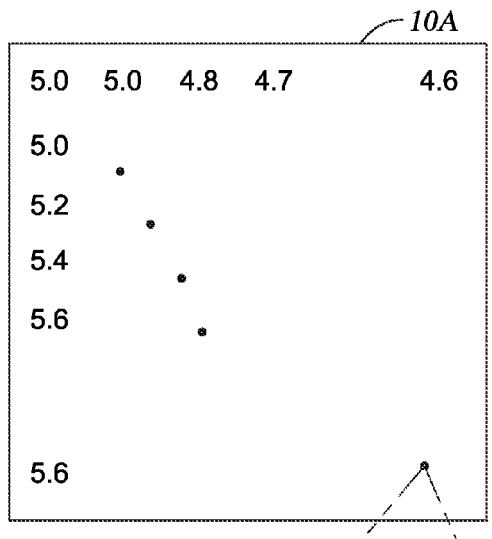
Fig. 7C     Fig. 7D
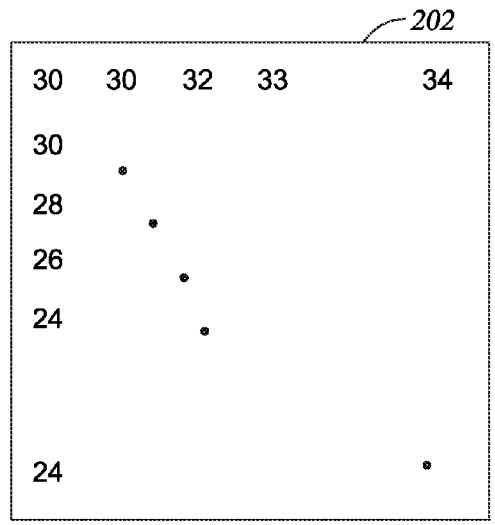
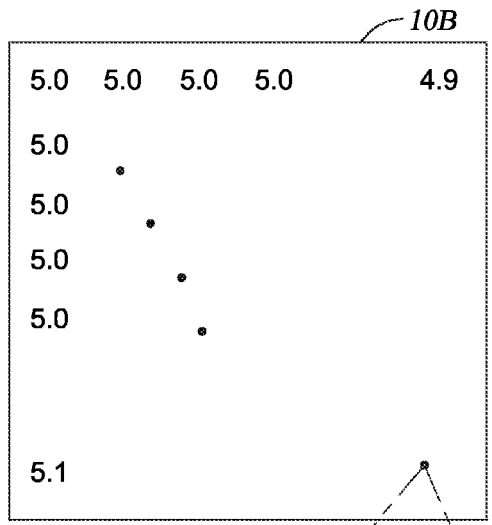
Fig. 7E     Fig. 7F

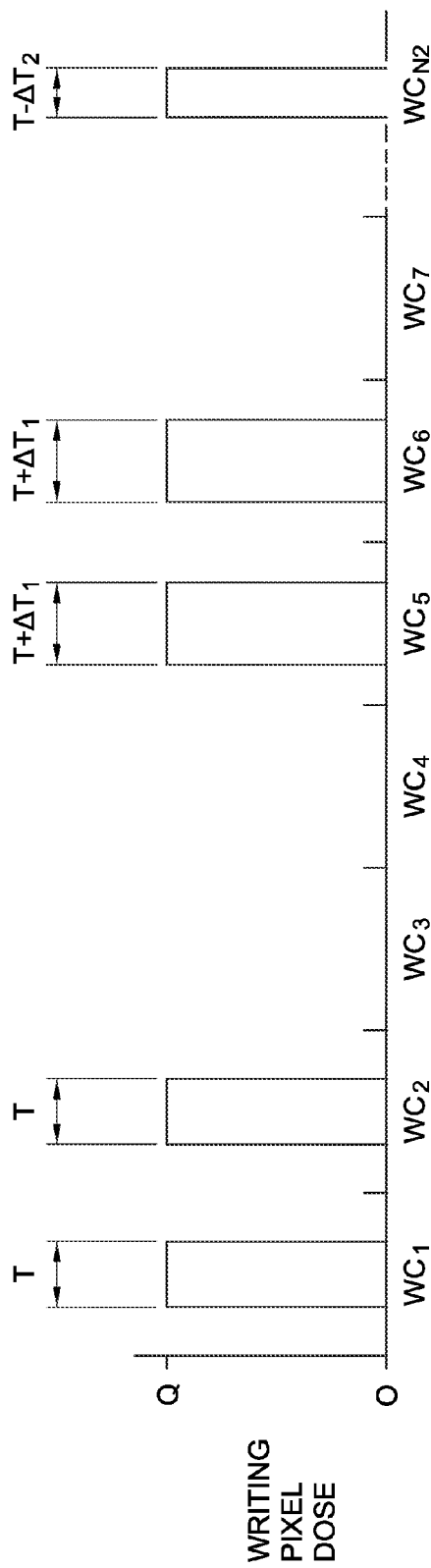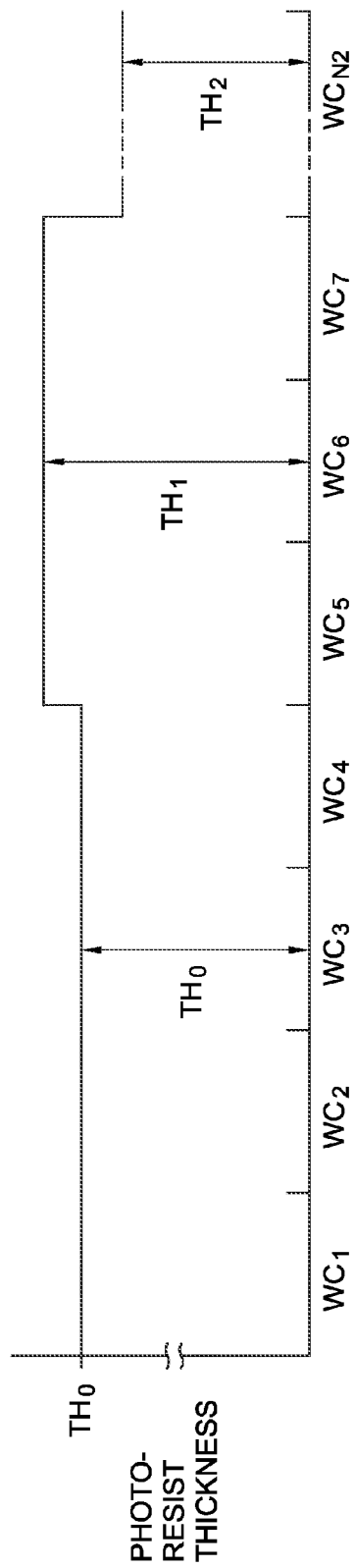

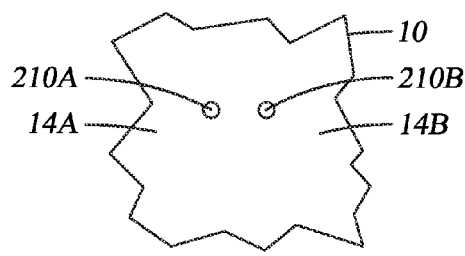
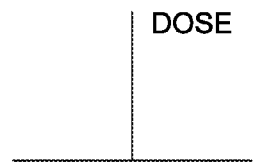
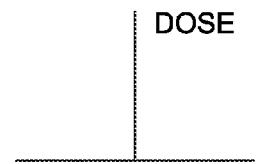
Fig. 13A     Fig. 14A     Fig. 15A
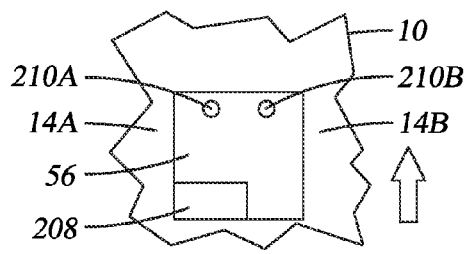
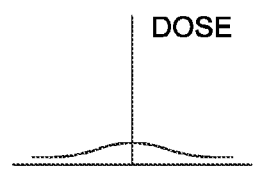
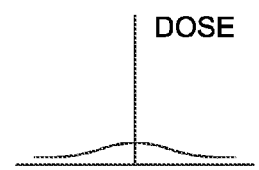
Fig. 13B     Fig. 14B     Fig. 15B
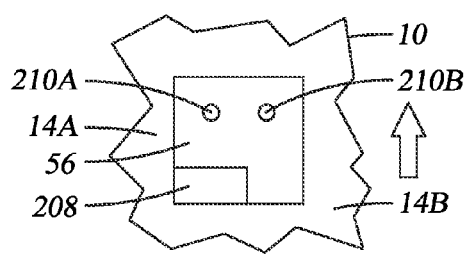
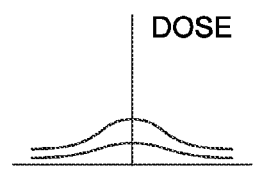
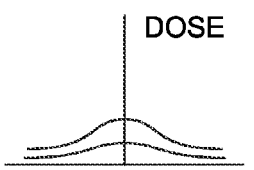
Fig. 13C     Fig. 14C     Fig. 15C

PATTERN GENERATORS EMPLOYING PROCESSORS TO VARY DELIVERY DOSE OF WRITING BEAMS ACCORDING TO PHOTORESIST THICKNESS, AND ASSOCIATED METHODS

BACKGROUND

Field

Embodiments of the present disclosure generally relate to apparatuses and methods for microlithography patterning and more particularly for microlithography patterning for large substrates with a photoresist film applied.

Description of the Related Art

Large area substrates are often utilized to support electrical features used in electronic devices. In some cases, large area substrates are used when manufacturing flat panels for active matrix displays such as computers, touch panel devices, personal digital assistances (PDAs), cell phones, television monitors, and the like. Generally, flat panels may comprise a layer of liquid crystal material forming pixels sandwiched between two plates. When power from the power supply is applied across the liquid crystal material during use, an amount of light passing through the liquid crystal material may be precisely controlled at pixel locations enabling images to be generated.

In some cases, microlithography techniques are employed to create electrical features incorporated as part of the liquid crystal material layer forming the pixels. According to this technique, a radiation-sensitive photoresist is applied to form a layer on a substrate surface with either a track or coater system to produce typically a sub-millimeter thickness of photoresist upon at least one surface of the substrate. In wafer microlithography often it is possible to achieve a uniform photoresist thickness of less than ten (10) nanometers of the photoresist upon a circular-shaped substrate by spinning the substrate to close to five-thousand (5,000) revolutions per minute for up to one (1) minute to distribute the photoresist across the substrate. However, in the case of large rectangular-shaped substrates, it is more difficult to achieve the same photoresist thickness uniformly across the substrate. Indeed, substrates for flat panel display manufacturing are in some cases sixteen (16) times larger than those substrates used in wafer microlithography and have a non-circular shape which makes effective spin coating of photoresist difficult. Variation in the photoresist thickness uniformity across the substrate results in variation in feature sizes of pattern features as formed in the photoresist across the substrate. This non-uniformity of feature size may negatively impact the performance of electronic devices formed by the pattern features, whether the substrate is intended to support flat panel display manufacturing or other electronic-based products.

In this regard, demand continues to increase for less expensive, larger, and higher performance electronic devices. Larger substrates with smaller and more uniform features are required to satisfy the demand for these electronic devices. New approaches are needed to more precisely create smaller and more uniform patterns on large substrates.

SUMMARY

Embodiments disclosed herein include multi-beam pattern generators employing processors to vary delivery dose of writing beams according to photoresist thicknesses, and associated methods. A pattern generator may write a pattern upon a substrate having a photoresist which is sensitive to the writing beams. The pattern may be written in respective writing cycles when the writing beams write at least a portion of the pattern at writing pixel locations. A beam actuator of the pattern generator may independently direct the writing beams to the writing pixels to deliver respective pixel doses during each writing cycle. Pixel doses delivered may be adjusted according to a thickness of the photoresist at various writing pixel locations according to one or more approaches, using one or more of: actuator dwell times, emitted pulse duration, emitted pulse frequency, and emitted pulse intensity. In this manner, additional dimensional control is provided for substrates having variable photoresist thicknesses.

In one embodiment a multi-beam pattern generator is disclosed. The pattern generator may include a stage configured to support a substrate in a plurality of writing cycle zone locations during respective ones of a plurality of writing cycles. The pattern generator may also include a writing beam actuator to independently direct each of a plurality of writing beams to writing pixel locations disposed upon a photoresist of the substrate. The pattern generator may also include a computer processor to adjust the delivered pixel dose for the respective writing pixel positions according to a thickness of the photoresist at the respective writing pixel locations. In this manner, more precise critical dimensional control of pattern features may be obtained on substrates with photoresist thickness variation.

In another embodiment, a method of writing a pattern with a multi-beam pattern generator is disclosed. The method may include supporting a substrate with a stage in a plurality of writing cycle zone locations during respective ones of a plurality of writing cycles. The method may also include instructing, with a computer processor, a writing beam actuator to independently direct a plurality of writing beams to writing pixel locations disposed upon a photoresist of the substrate. The method may also include adjusting writing pixel doses delivered to the writing pixel locations according to a thickness of the photoresist at a portion of the substrate. In this manner, resulting electrical devices formed with the pattern on the substrate may have more predictable performance characteristics.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE DRAWINGS

So that the manner in which the above recited features of embodiments of the present disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for embodiments of the disclosure may admit to other equally effective embodiments.

FIGS. 6A through 6D are charts illustrating modulating angular positions of an exemplary mirror of the SLM to adjust for deviations in photoresist thickness, wherein the charts depict, respectively, angular mirror positions, emitted doses to the mirror, reflected doses from the SLM to the photoresist, and photoresist thickness at the writing pixel locations for several writing cycles;

FIG. 7C is a top view of an exemplary metrology substrate depicting uniform pixel doses superimposed onto location of the substrate which has a metrology pattern including uniform feature sizes written using writing pixels in photoresist exposed with the uniform pixel doses;

FIG. 7D is a top view of the metrology substrate of FIG. 7C depicting line width measurements of the metrology features superimposed onto respective locations of the substrate;

FIG. 7E is a digital dose correction map establishing a relationship between a nominal dose and respective locations of the substrate;

FIG. 7F is a top view of another exemplary metrology substrate depicting linewidth measurements of the metrology features of the metrology pattern superimposed onto respective locations of the substrate written using the dose correction map of FIG. 7E, wherein the linewidth measurements are of features resulting from the photoresist being developed and the substrate optionally etched;

FIGS. 10A through 10D are charts associated with modulating durations of light pulses received by the exemplary mirror of the SLM to adjust for deviations in photoresist thickness, wherein the charts depict, respectively, angular mirror positions, emitted doses to the mirror, reflected doses from the SLM to the photoresist, and photoresist thickness at the writing pixel locations for several writing cycles;

FIGS. 13A through 13F are schematic drawings of a portion of the SLM disposed in six (6) respective writing cycle zone locations while writing a first feature and a second feature on an exemplary substrate as part of a different operation embodiment of the writing beam actuator of FIG. 2, illustrating that a portion of mirrors of the SLM may be turned off to modulate dose delivered according to thickness of the photoresist;

FIGS. 14A through 14E are schematic drawings, respectively, of cumulative dosage delivered to the first feature of FIGS. 13A through 13E; and FIGS. 15A through 15E are schematic drawings, respectively, of cumulative dosage delivered to the second feature of FIGS. 13A through 13E.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed herein include multi-beam pattern generators employing processors to vary delivery dose of writing beams according to photoresist thicknesses, and associated methods. A pattern generator may write a pattern upon a substrate having a photoresist which is sensitive to the writing beams. The pattern may be written in respective writing cycles when the writing beams write at least a portion of the pattern at writing pixel locations. A beam actuator of the pattern generator may independently direct the writing beams to the writing pixels to deliver respective pixel doses during each writing cycle. Pixel doses delivered may be adjusted according to a thickness of the photoresist at various writing pixel locations according to one or more approaches, using one or more of: actuator dwell times, emitted pulse duration, emitted pulse frequency, and emitted pulse intensity. In this manner, additional dimensional control is provided for substrates having variable photoresist thicknesses.

Figure 1A:
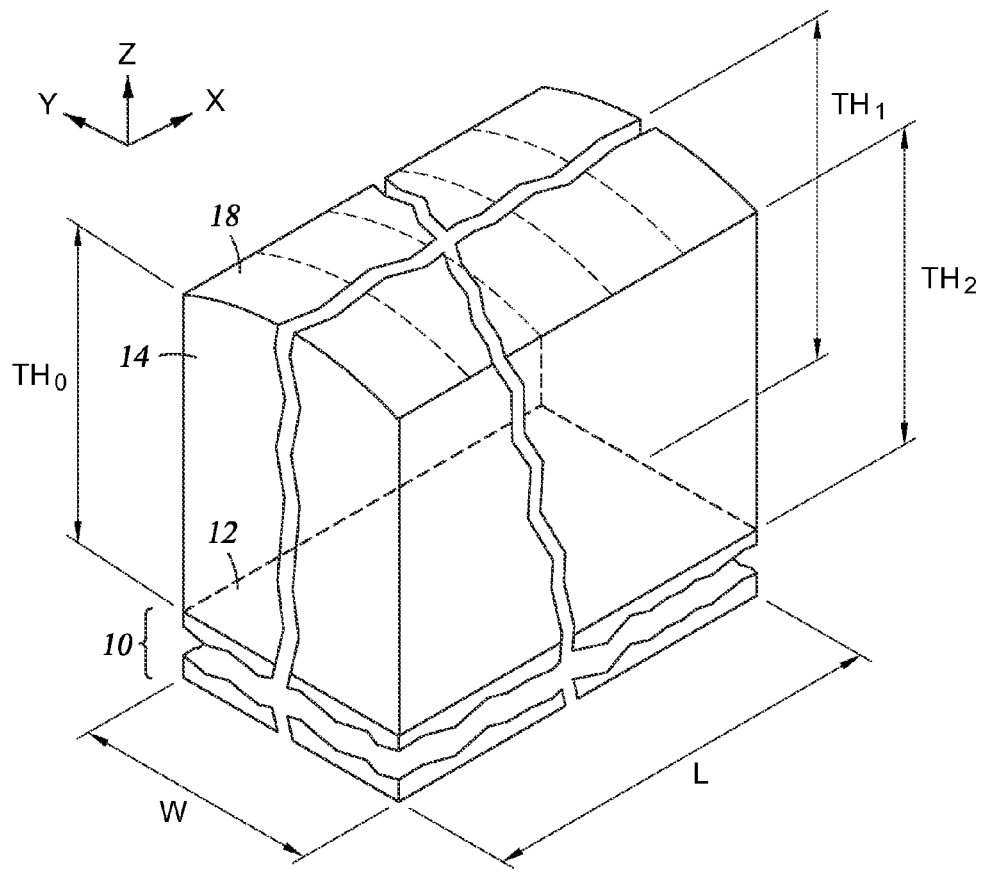
FIG. 1A is a top perspective view of an exemplary substrate including a photoresist having variable photoresist thickness represented by nominal, high and low values.

In this regard, FIG. 1A is a top perspective view of an exemplary substrate 10. The substrate 10 may, for example, comprise quartz and be used as part of a flat panel display. The substrate 10 may also include a first surface 12 having rectangular-shape with a length L of at least 2.4 meters and a width W of at least 2.1 meters. In this manner, the first surface 12 of the substrate 10 may support a pattern 24, discussed later relative to FIG. 5A, having dimensional features associated with electronic circuitry.

The pattern 24 may be formed by writing the pattern 24 in a photoresist 14 (also known as "resist") attached to the first surface 12. The photoresist 14 is sensitive to radiation and may be a positive photoresist or negative photoresist, meaning that portions of the photoresist 14 exposed to radiation will be respectively soluble or insoluble to photoresist developer applied to the photoresist 14 after the pattern 24 is written into the photoresist 14. The chemical composition of the photoresist 14 determines whether the photoresist 14 will be a positive photoresist or negative photoresist. For example, the photoresist 14 may include at least one of diazonaphthoquinone, a phenol formaldehyde resin, poly(methyl methacrylate), poly(methyl glutarimide), and SU-8. In this manner, the pattern may be created on the first surface 12 of the substrate 10 to form the electronic circuitry.

Another characteristic of the photoresist 14 is the thickness. The photoresist 14 may have an outer surface 18 facing away from the first surface 12 of the substrate 10. A thickness $TH_0$ is the nominal thickness of the photoresist 14 between the outer surface 18 of the photoresist 14 and the first surface 12 of the substrate 10. The nominal thickness $TH_0$ may be in a range, for example, from twenty (20) nanometers to two (2) microns. The thickness of the photoresist 14 may vary according to a location of the portion of the photoresist 14 in the x-direction and the y-direction as depicted by thicknesses $TH_1$, $TH_2$. The thickness $TH_1$, $TH_2$ of the photoresist 14 may be a factor to determine feature dimensions of the pattern 24 formed within the photoresist 14.

Figure 1B:
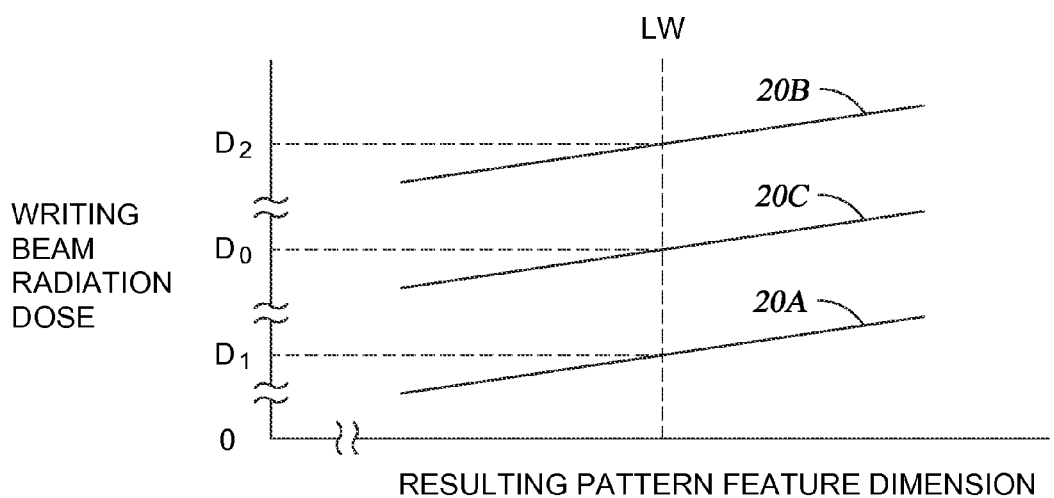
FIG. 1B is a graph of writing beam radiation dose versus resulting pattern feature dimension illustrating a higher writing beam dose is associated with an increased photoresist thickness to produce the same resulting pattern feature dimension.

In this regard, FIG. 1B is a graph of writing beam radiation dose versus resulting pattern feature dimension. The graph contains three lines 20A-20C representing an amount of radiation dose required to create various pattern feature dimensions for the photoresist thickness $TH_2$, the photoresist thickness $TH_1$, and a nominal thickness $TH_0$, respectively, using a positive photoresist. Larger photoresist thicknesses for positive photoresist types require additional dose to write a feature of the pattern 24. For example, to create a pattern feature having a linewidth LW in the photoresist 14, the photoresist thickness $TH_1$ represented by line 20B would need a radiation dose $D_2$ whereas the photoresist thickness $TH_2$ represented by line 20A would need a radiation dose $D_1$. As the nominal photoresist thickness $TH_0$ may be between the thicknesses $TH_1$, $TH_2$, of the photoresist 14, the nominal dose $D_0$ may have a value between the radiation doses $D_1$, $D_2$. Creating a pattern with a negative photoresist may also have dimensions that are dependent upon photoresist thickness. Data providing the thickness of the photoresist 14 at each x-position and y-position of the photoresist 14 may be used along with the type of the photoresist 14 to adjust the radiation dose exposure when the pattern 24 is written in the photoresist 14. In this manner, better dimensional control of the pattern 24 may be achieved.

Figure 2:
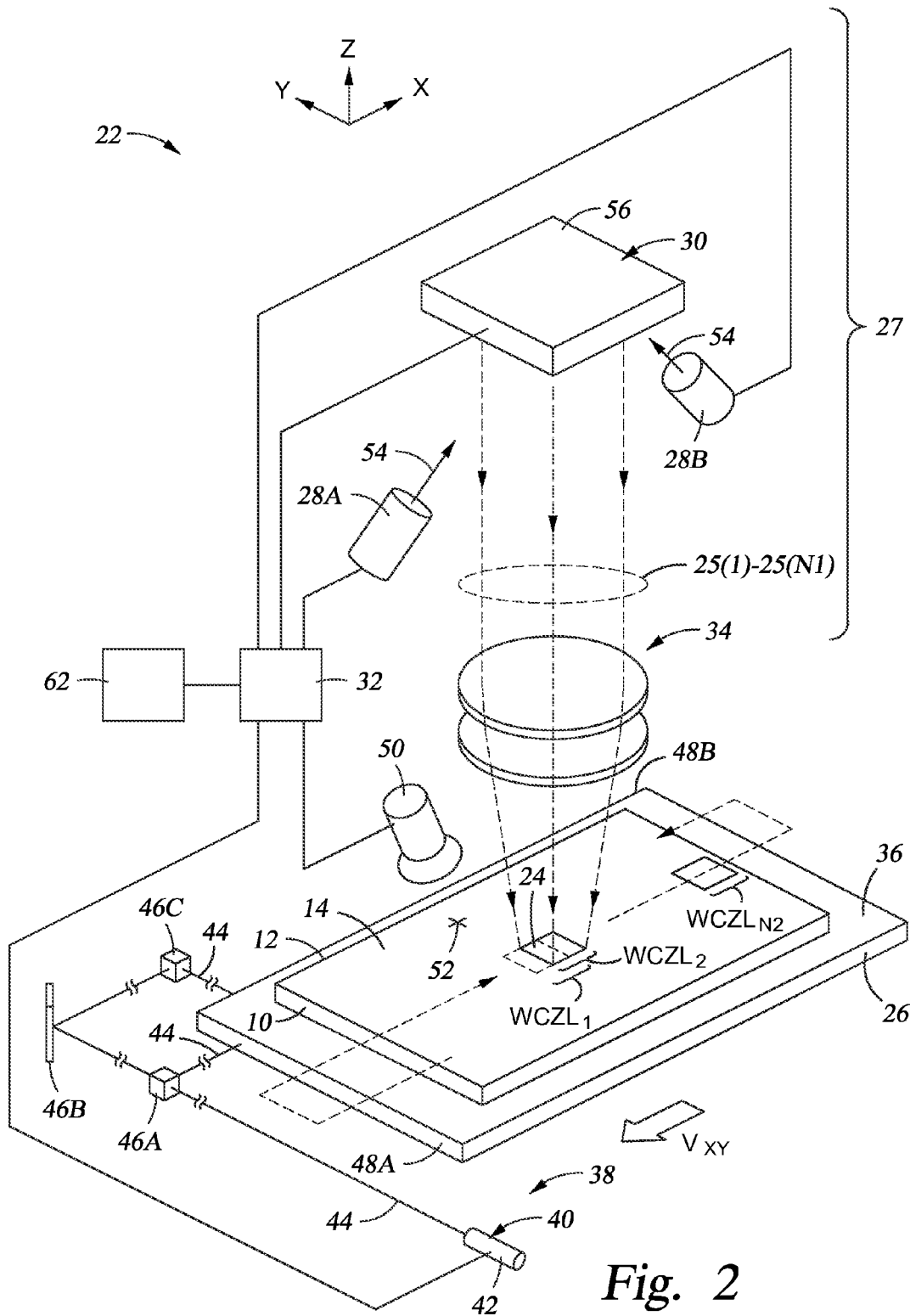
FIG. 2 is a top perspective schematic view of an exemplary multi-beam pattern generator including one embodiment of a writing beam actuator independently directing a plurality of writing beams to writing pixel locations in the photoresist, wherein dose delivered by the writing beams upon the writing pixel locations during writing cycles may be individually determined according to photoresist thicknesses at the respective writing pixel locations.

FIG. 2 is a top perspective schematic view of an exemplary multi-beam pattern generator 22 writing the pattern 24 with a plurality of writing beams 25(1)-25(N) in the photoresist 14 attached to the substrate 10. The pattern generator 22 includes a stage 26 and a writing mechanism 27. The writing mechanism 27 may include at least one light source 28A, 28B, a writing beam actuator 30, a computer processor 32, and an optical device 34. Details of each of these components of the multi-beam pattern generator 22 are now discussed in sequence.

The stage 26 may support the substrate 10 and move the substrate 10 relative to the writing beam actuator 30. The stage 26 may include at least one support surface 36 to support the substrate 10 in the z-direction. The stage 26 may move with the velocity $V_{xy}$ in the x-direction and/or the y-direction to provide movement between the substrate 10 and the writing beam actuator 30, so that portions of the pattern 24 may be written by the writing beams 25(1)-25(N1) during at least one writing cycle WC. The portions of the pattern 24 written in the writing cycles $WC_1$, $WC_2$, $WC_{N2}$ are shown as $WCZL_1$, $WCZL_2$, $WCZL_{N2}$, respectively. Each of the writing cycle $WC_1$, $WC_2$, $WC_{N2}$ may be written in a speed of at least fifteen (15) kilohertz. The path of the stage 26 may be, for example, a serpentine shape to completely write the pattern 24 in the photoresist 14. The stage 26 may also include an electric motor (not shown) to provide movement. In this way, the substrate 10 may be positioned during writing of the pattern 24.

With continued reference to FIG. 2, the stage 26 also may include a location device 38 to determine a location of the stage 26 and the substrate 10 during writing. In one embodiment, the location device 38 may comprise an interferometer 40, including a laser 42 to emit a laser beam 44 directed by optical components 46A, 46B, 46C to adjacent sides 48A, 48B of the stage 26. Data from the location device 38 may be provided to the computer processor 32 regarding changes in the position of the stage 26 in the x-direction and/or y-direction.

To ensure that the location of the substrate 10 may be established relative to the stage 26, the location device 38 may also include an alignment camera 50. The alignment camera 50 may include an optical sensor, for example a charge coupling device, to read at least one alignment mark 52 on the substrate 10 to register the substrate 10 to the stage 26 and the writing beam actuator 30. The alignment camera 50 may be coupled to the computer processor 32 to facilitate the determination of the pattern 24 upon the substrate 10. In this regard, once the substrate 10 may be registered via the alignment camera 50, the position of the substrate 10 with regards to the stage 26 may be determined.

Next, the pattern generator 22 includes the light source 28A, 28B. In the embodiment shown in FIG. 2, the light sources 28A, 28B may comprise at least one laser which emits light 54 towards the writing beam actuator 30. The light sources 28A, 28B may be configured to emit the light 54 with wavelengths consistent with the use of the photoresist 14. For example, the wavelength may be less than or equal to four-hundred five (405) nanometers. In this manner, the writing beam actuator 30 may be supplied with radiation energy to be directed as the writing beams 25(1)-25($n$1) to writing pixel locations WPL (discussed later relative to FIGS. 5A-5C) on the photoresist 14.

With continued reference to FIG. 2, the writing beam actuator 30 is discussed now. In one embodiment, the writing beam actuator 30 may be a spatial light modulator 56 ("SLM"). The SLM 56 comprises mirrors 58(1)-58(N1) which are individually controlled by signals from the computer processor 32. The SLM 56 may be, for example, a DLP9500-type digital mirror device made by Texas Instruments Incorporated of Dallas, Tex. The SLM 56 may have the plurality of mirrors 58(1)-58(N1), for example, arranged in 1920 columns and 1080 rows. In this manner, the light 54 may be deflected by the mirrors 58(1)-58(N1) to the photoresist 14.

Figure 3:
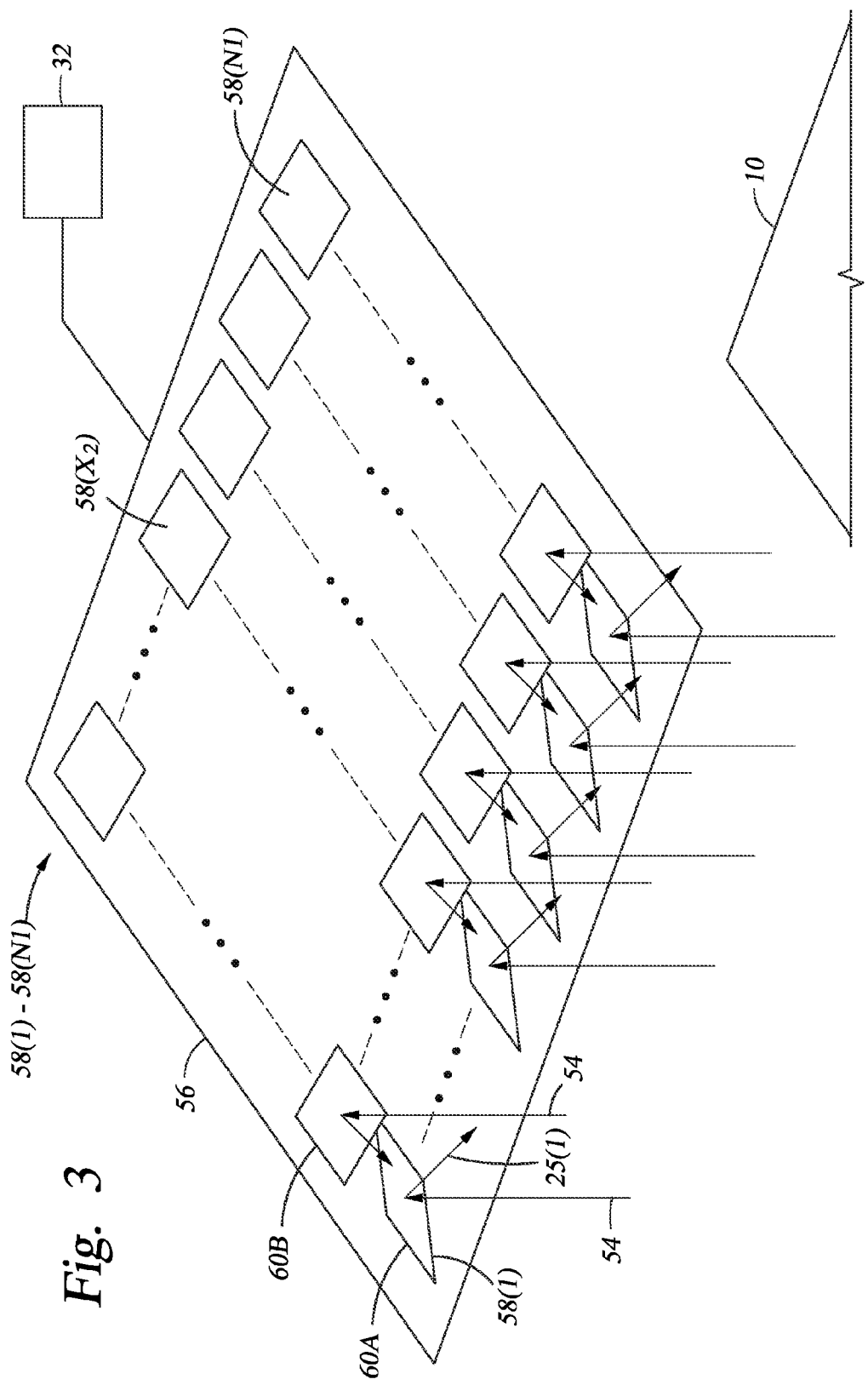
FIG. 3 is a top perspective schematic view of one embodiment of the writing beam actuator of FIG. 2 illustrating active positions and inactive positions of mirrors of a spatial light modulator (SLM) to individually direct each of the plurality of writing beams to the writing pixel locations.

In this regard, FIG. 3 is a top perspective schematic view of the SLM 56 illustrating active positions 60A and inactive positions 60B of mirrors 58(1)-58(N1) of the SLM 56 to individually direct each of the writing beams 25(1)-25(N1) to the writing pixel locations for respective dwell times during a writing cycle WC. Each of the mirrors 58(1)-58(N1) of the SLM 56 may be configured to be individually actuate-able (or digitally controlled) from the respective inactive position 60B to the respective active position 60A in order to reflect a respective portion of the light 54 to the substrate 10. Each of the mirrors 58(1)-58(N1) may reflect a portion of the light 54 to the substrate 10 while in the active position 60A, and less than five (5) percent of this reflected portion to the substrate 10 when in the inactive position 60B. The radiation energy of the light 54 may be deposited across the pattern 24 in various ones of the writing cycle zone locations $WCZL_1$-$WCZL_{N2}$. It is noted that the writing cycle zone locations $WCZL_1$-$WCZL_{N2}$ may overlap as depicted in FIG. 2. In this manner, features of the pattern 24 may be determined from multiple writing cycles to reduce positional error as the radiation energy delivered in any single writing cycle to the substrate 10 is averaged with the radiation energy delivered in other writing cycles WC to form the pattern 24.

With reference back to FIGS. 2 and 3, the pattern generator 22 also includes a computer processor 32. The computer processor 32 may instruct the mirrors 58(1)-58(N1) to be in the active position 60A or the inactive position 60B in each writing cycle. The computer processor 32 also may determine dwell time for each of the mirrors 58(1)-58(N1) and/or pixel dose information for embodiments discussed later, for example, from location data received from the location device 38, photoresist thickness TH information received from a storage device 62, and pattern information received from the storage device 62. The dwell time may also be determined based on patterned feature size (i.e., linewidth) obtained after downstream processing such as photoresist develop or substrate etching.

In this regard, in one embodiment, the computer processor 32 may use the location data received from the location device 38 to determine respective expected incident locations ("writing pixel locations $WPL_1$-$WPL_{N1}$") of each of the respective ones of the writing beams 25(1)-25(N1) upon the photoresist 14 during respective ones of the writing cycles. The computer process 32 may determine whether various ones of the mirrors 58(1)-58(N1) are to be actuated to the active position 60A based upon whether the writing pixel locations $WPL_1$-$WPL_{N1}$ of each of the respective writing beams 25(1)-25(N1) are disposed within a feature 64 (see FIGS. 5A-5C) of the pattern 24 to be written in the photoresist 14. The computer processor 32 may also determine the photoresist thicknesses TH(1)-TH(N1) at the respective expected incident locations based on the information stored in the storage device 62. The computer processor 32 may also determine respective writing beam radiation doses associated with the respective photoresist thicknesses at the respective incident locations by accessing information consistent with FIG. 1B formatted, for example, as look-up tables or a dose correction map in the storage device 62. The computer processor 32 may convert the respective writing beam radiation doses to dwell times (or laser pulse power, or more/less mirror actuations (shots)) according to, for example, a linear relationship. In this manner, the computer processor 32 may adjust the pixel dose for respective writing pixel positions according to the photoresist thickness at respective writing pixel locations. Consequently, additional control of feature dimensions is provided for substrates having variable photoresist thickness.

Figure 4A:
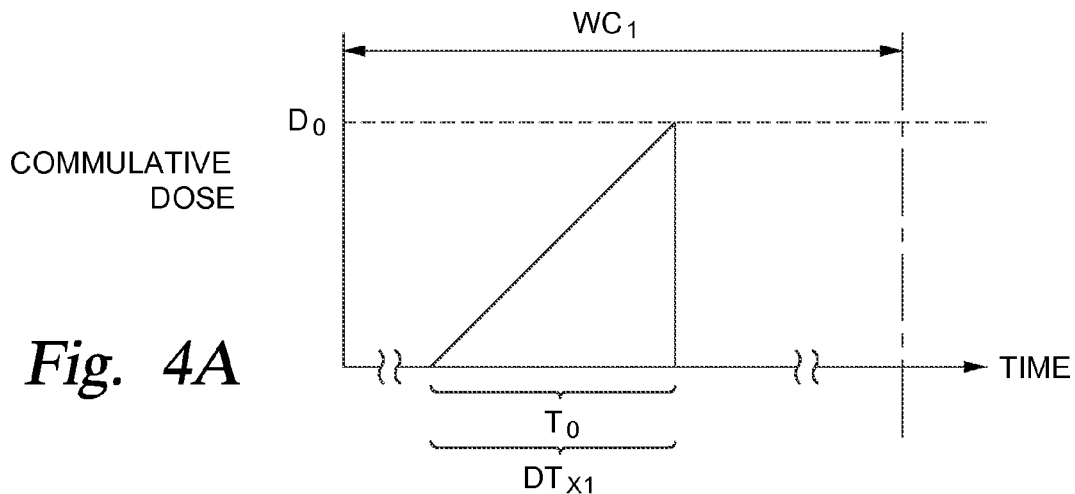
FIGS. 4A-4C are graphs of cumulative dose of a writing beam upon a writing pixel location during a writing cycles illustrating determining dwell times of a mirror to direct a writing beam to a writing pixel location during a writing cycle for a nominal photoresist thickness, an increased photoresist thickness, and a reduced photoresist thickness, respectively.
Figure 4B:
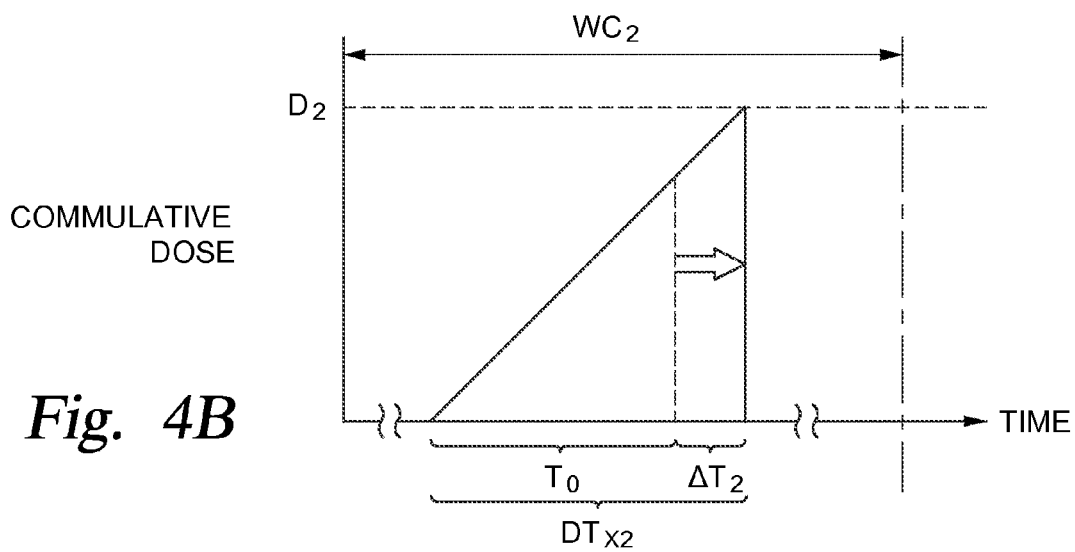
Figure 4C:
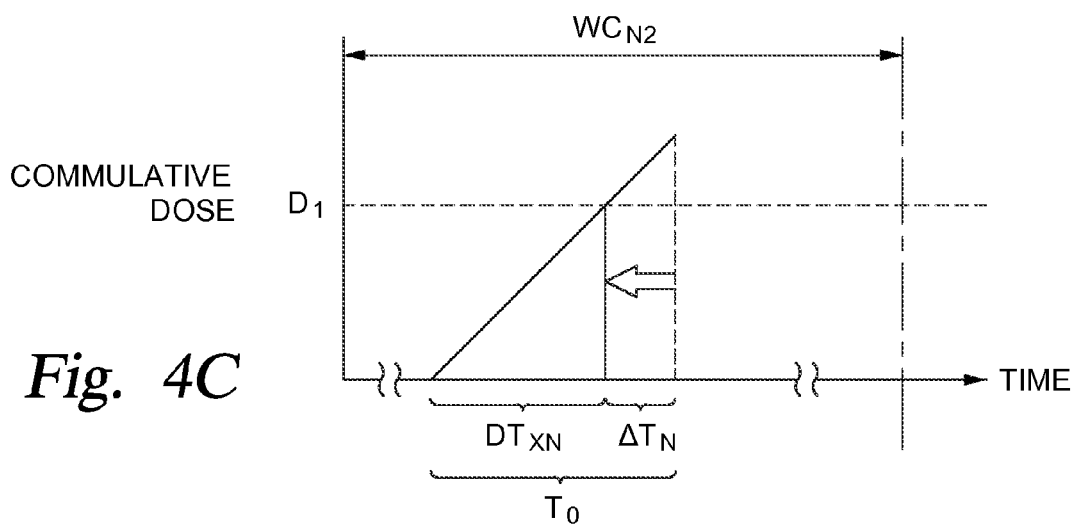

FIGS. 4A-4C provide additional examples of adjusting dwell time from a nominal value according to the thickness of the photoresist 14. Specifically, FIGS. 4A-4C are graphs of cumulative dose of a writing beam upon a writing pixel location during writing cycles. In this regard, dwell time adjustments are depicted for a nominal photoresist thickness, an increased photoresist thickness, and a reduced photoresist thickness, respectively. FIGS. 4A-4C will be discussed in conjunction with FIGS. 5A-5C, which are top perspective schematic views of mirrors 58(1)-58($N_1$) of the SLM 56 of FIG. 3 writing exemplary pattern features 64(1), 64(2), 64($N_2$) with a dwell time adjustment consistent with FIGS. 4A-4C, respectively, in the writing cycle zone locations $WCZL_1$-$WCZL_{N2}$ depicted in FIG. 2.

Figure 5A:
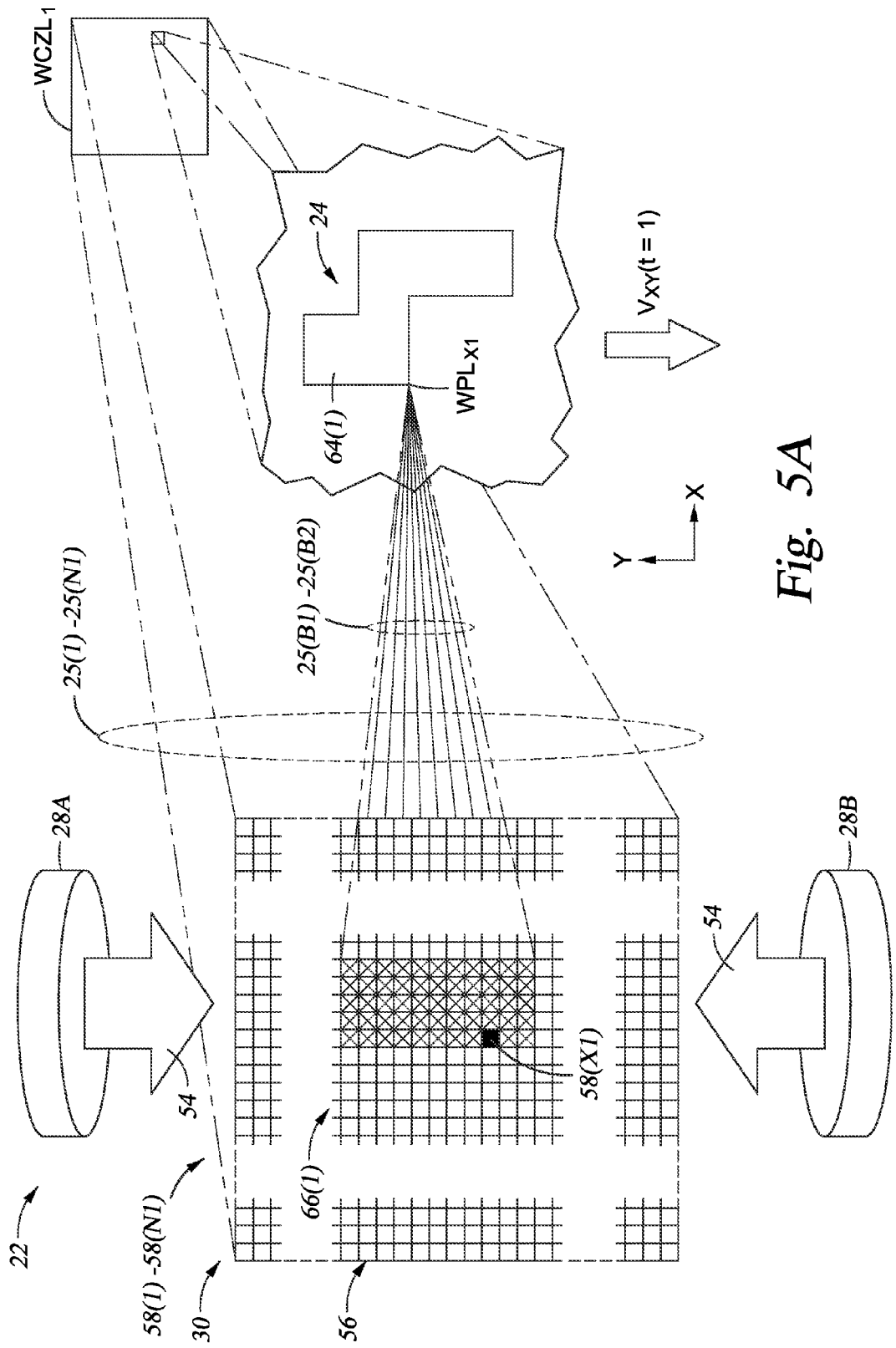
FIGS. 5A through 5C are top perspective schematic views of mirrors of the SLM of FIG. 3 writing pattern features consistent with respective dwell times of FIGS. 4A-4C and writing cycle zone locations of FIG. 2, respectively.
Figure 5B:
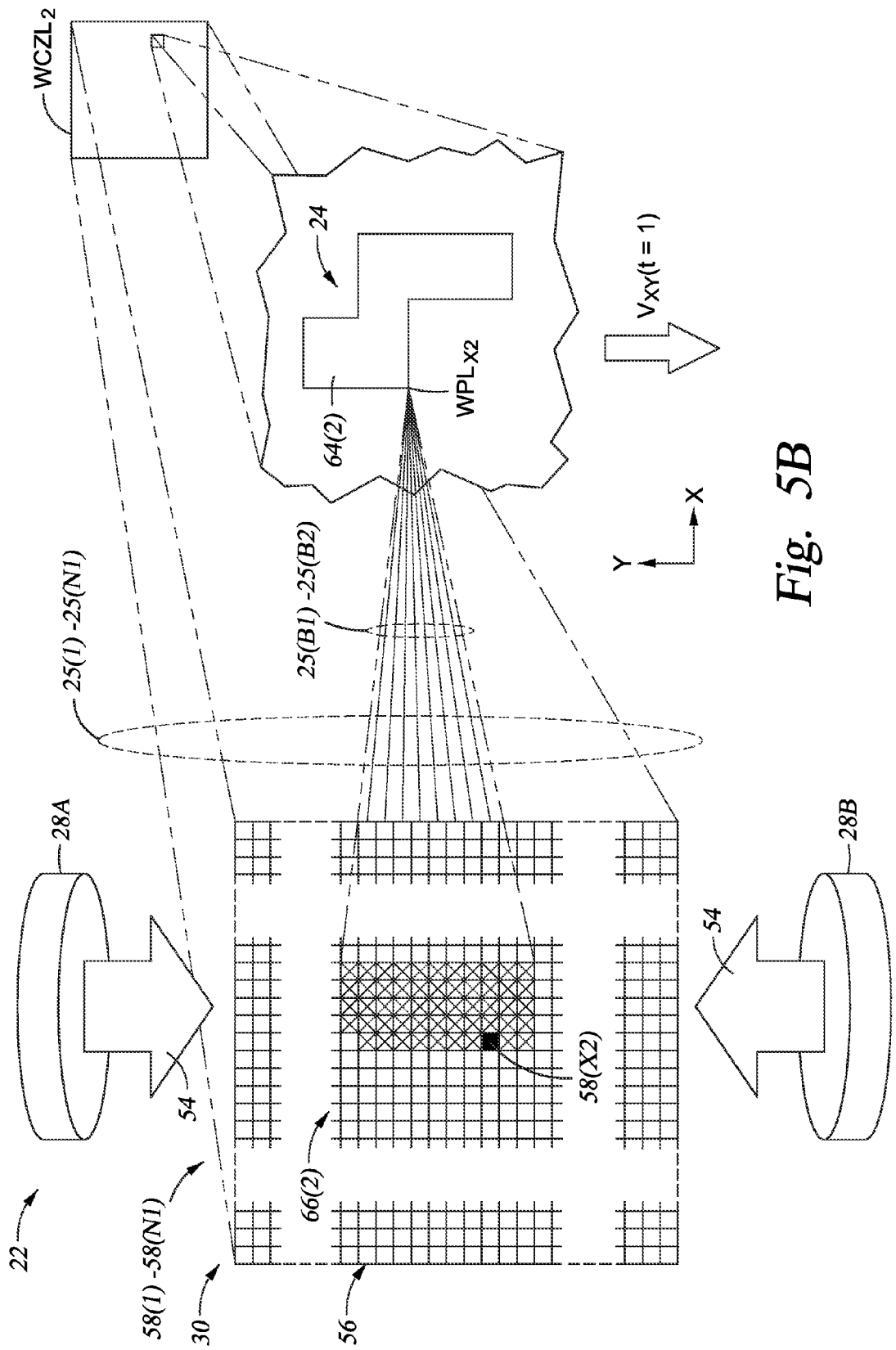

In FIGS. 4A and 5A, a nominal dose $D_0$ (FIG. 1B) associated with delivering radiation energy to the writing pixel location $WPL_{X1}$ having a nominal photoresist thickness $TH_0$ is shown (see FIG. 1A). In this depicted situation, a feature 64(1) of the pattern 24 may be within the first writing cycle zone location $WCZL_1$ (see FIGS. 2 and 5A) during a writing cycle $WC_1$. The writing beams 25(1)-25($N_1$) may be formed by reflecting with actuated ones of the mirrors 58(1)-58($N_1$) the light 54 from the light sources 28A, 28B into the first writing cycle zone location $WCZL_1$ in the photoresist 14. The writing pixel location $WPL_{X1}$ at the corner of the feature 64(1) may be associated with mirror 58($x$1) and the nominal photoresist thickness $TH_0$. It is noted that a portion 66(1) of the mirrors 58(1)-58(N) may be used to form writing beams 25(B1)-25(B2) to write a corner of the feature 64(1). As shown in FIG. 4A, the dwell time $DT_{X1}$ required for the mirror 58($x$1) in the actuated position 60A to deliver the cumulative dose $D_0$ to the respective writing location $WPL_{X1}$ is depicted. The dwell time $DT_{X1}$ may be in a range, for example, from zero (0) to one-hundred (100) microseconds. The computer processor 32 may instruct the mirror 58($x$1) to be in the actuated position 60A for a dwell time $DT_{X1}$ during the writing cycle $WC_1$. In this manner, the feature 64(1) may be written with precise control. In some cases, the mirrors of the SLM 56 may operate according to a clock rate having a constant frequency so that the time period at which the mirrors are in the actuated position is constant. In these cases, a time period that a pulse of radiation may be sent to the mirrors may be changed as discussed later in other embodiments.

In contrast to FIGS. 4A and 5A, FIGS. 4B and 5B are associated with the photoresist thickness $TH_1$ local situation where the thickness $TH_1$ of the photoresist 14 is greater than the nominal photoresist thickness $TH_0$. Here, a dose $D_2$ (FIG. 1B) associated with delivering radiation energy to the writing pixel location $WPL_{X2}$ having the photoresist thickness $TH_1$ is shown (see FIGS. 1A and 5B). In this depicted situation, a feature 64(2) of the pattern 24 may be within the second writing cycle zone location $WCZL_2$ (see FIGS. 2 and 5B) during a writing cycle $WC_2$. Similarly, the writing beams $25(1)$-$25(N_1)$ may be formed by reflecting with actuated ones of the mirrors $58(1)$-$58(N_1)$ the light 54 from the light sources 28A, 28B into the second writing cycle zone location $WCZL_2$ in the photoresist 14. The writing pixel location $WPL_{X2}$ at the corner of the feature 64(2) may be associated with mirror $58(x_2)$ and the photoresist thickness $TH_1$. A portion 66(2) of the mirrors $58(1)$-$58(N_1)$ may be used to form writing beams $25(B_1)$-$25(B_2)$ to write the corner of the feature 64(2). As shown in FIG. 4B, the dwell time $DT_{X2}$ required for the mirror $58(x_2)$ to be in the actuated position 60A for to deliver the dose $D_1$ to the respective writing location $WPL_{X2}$ is depicted. The computer processor 32 may instruct the mirror $58(x_2)$ to be in the actuated position 60A during the writing cycle $WC_2$. In this manner, the feature 64(2) may be written with specified dimensions.

Figure 5C:
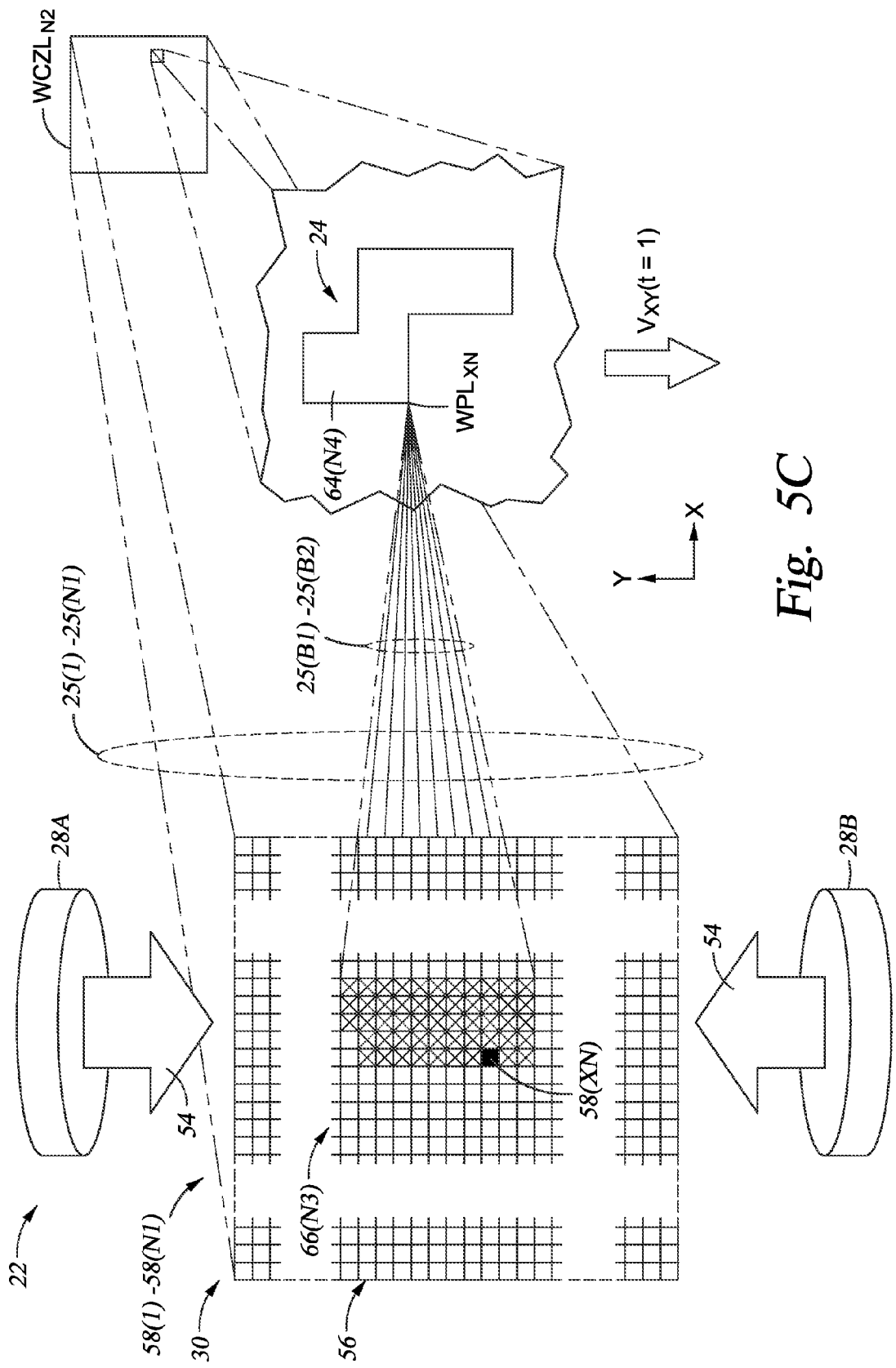

In further contrast, FIGS. 4C and 5C are associated with the photoresist thickness $TH_2$ situation. Here, a dose $D_1$ (FIG. 1B) associated with delivering radiation energy to the writing pixel location $WPL_{XN}$ having a photoresist thickness $TH_2$ is shown (see FIG. 1A). In this depicted situation, a feature $64(N_2)$ of the pattern 24 may be within the writing cycle zone location $WCZL_{N2}$ (see FIGS. 2 and 5C) during a writing cycle $WC_{N2}$. Similarly, the writing beams $25(1)$-$25(N_1)$ may be formed by reflecting with actuated ones of the mirrors $58(1)$-$58(N_1)$ the light 54 from the light sources 28A, 28B into the writing cycle zone location $WCZL_{N2}$ in the photoresist 14. The writing pixel location $WPL_{XN}$ at the corner of the feature $64(N_2)$ may be associated with mirror $58(x_N)$ and the photoresist thickness $TH_2$. It is noted that a portion $66(N_3)$ of the mirrors $58(1)$-$58(N_1)$ may be used to form writing beams $25(61)$-$25(B2)$ to write the corner of the feature $64(N_4)$. As shown in FIG. 4C, the dwell time $DT_{XN}$ required for the mirror $58(x_N)$ in the actuated position 60A to deliver the dose $D_1$ to the respective writing location $WPL_{XN}$ is depicted. The computer processor 32 may instruct the mirror $58(x_N)$ to be in the actuated position 60A during the writing cycle $WC_{N2}$. In this manner, the feature $64(N_4)$ may be written with specified dimensions.

The operation of the writing beam actuator 30 may be described relative to the performance of a single writing beam $25(X_2)$ as controlled by an exemplary mirror $58(X_2)$ (see FIG. 3) as the pattern 24 is written over various writing cycles $WC_1$-$WC_{N2}$. In this regard, FIGS. 6A through 6D are charts illustrating the operating embodiment of the mirror $58(X_2)$ as controlled by the computer processor 32 of FIG. 2. Consistent with the discussion above for this embodiment, the light 54 may be uniformly emitted to the mirror $58(X_2)$ of the SLM 56 as shown in FIG. 6B during the writing cycles $WC_1$-$WC_{N2}$. As the SLM 56 is moved (FIG. 2) relative to the substrate 10, the writing beam $25(X_2)$ may write at various writing pixel locations in the photoresist 14 as the computer processor 32 instructs the mirror $58(X_2)$ to be in either the actuated position 60A ("ON" position) or in the inactive position 60B ("OFF" position). In one case as shown in FIG. 6A, the pattern 24 may require the mirror $58(X2)$ to expose the photoresist 14 at respective writing pixel locations in writing periods $WC_1$, $WC_2$, $WC_5$, $WC_6$, and $WC_{N2}$. The pattern 24 may also require the mirror $58(X_2)$ to not expose the photoresist 14 during the writing cycles $WC_3$, $WC_4$, and $WC_7$. In this manner, the mirror $58(X2)$ may contribute to the writing of the pattern 14. Resulting feature sizes may vary according to the thickness of the photoresist at the writing pixels.

The linewidth uniformity error contribution from resist thickness variations may be minimized by adjusting the total dose delivered by the mirror $58(X2)$ during the writing cycles $WC1$-$WC_{N2}$ according to the thickness of the photoresist 14. FIG. 6D depicts thicknesses of the photoresist 14 on the substrate 10 at the various writing pixels associated with the mirror $58(X_2)$ during each the writing cycles $WC_1$-$WC_{N2}$. In one case, the thickness $TH_0$ of the photoresist 14 may be associated with the writing cycles $WC_1$-$WC_4$, the thickness $TH_1$ thicker than $TH_0$ may be associated with the writing cycles $WC_5$-$WC_7$, and the thickness $TH_2$ which is narrower than $TH_0$ may be associated with writing cycle $WC_{N2}$. In this manner, the thickness of the photoresist 14 may be used to adjust total dose delivered at each writing pixel to achieve better linewidth uniformity.

The relationship between total dose and line width was discussed earlier in relationship to FIG. 1B and FIGS. 4A-4C. In this regard, the mirror $58(X_2)$ may be moved to the actuated position 60A for a dwell time T during the writing cycle WC1 and WC2 to produce the writing pixel dose of dwell time T at the photoresist as shown in FIG. 6C. The dwell time T may be associated with creating feature sizes with the photoresist thickness $TH_0$. In contrast, during the writing cycles $WC_5$ and $WC_6$, the mirror $58(X2)$ may be moved to the actuated position 60A for the dwell times $T+\Delta T_1$. The dwell time $T+\Delta T_1$ may be greater than the dwell time T. The dwell time $T+\Delta T_1$ may be associated with the thickness $TH_1$ of the photoresist 14 (FIG. 6D). In this manner, feature sizes of the pattern may be created by the mirror $58(X2)$ during the writing cycles $WC_5$, $WC_6$ similar to the features created during the writing cycles $WC_1$, $WC_2$.

A dose delivered to the photoresist 14 can also be adjusted to achieve the same feature sizes for writing cycles when the thickness of the photoresist is thinner. For example, in the writing cycle $WC_{N2}$, the mirror $58(X2)$ may be moved to the actuated position 60A for the dwell time $T-\Delta T_2$. The dwell time $T-\Delta T_2$ may be less than the dwell time T. The dwell time $T+\Delta T_1$ may be associated with the thickness $TH_2$ of the photoresist 14 (FIG. 6D). In this manner, the writing pixel dose may be delivered to the photoresist 14 to write the pattern 14 while compensating for thickness deviations of the photoresist which deviate to be thinner.

It is noted that as shown in FIG. 6C, no writing pixel dose may be delivered to the photoresist 14 via the mirror $58(X_2)$ during the writing cycles $WC_3$, $WC_4$ and $WC_7$ as the mirror is in the inactive position 60B. Thus, no compensation for the photoresist thickness may be necessary. Now that the operation of the computer processor 32 has been described, additional features of the pattern generator 22 are provided. With reference back to FIG. 2, the pattern generator 22 may also include the optical device 34. The optical device 34 may include a reduction ratio to reduce the size of the writing beams $25(1)$-$25(N_1)$ at the writing pixel location in the photoresist 14. The reduction ratio may be in a range from 1:1 to 5:1. In this regard, the optical device 34 may include at least one lens including at least one convex surface and/or concave surface between the stage 26 and the writing beam actuator 30. The optical device 34 may comprise a material of high transmissibility (for example: quartz) for various wavelengths of the light 54 to focus the writing beams 25(1)-25($N_1$) upon the photoresist 14. In one embodiment, when various ones of the mirrors 25(1)-25($N_1$) are in the active position 60A, the effective pitch separating centers of adjacent ones of the writing beams 25(1)-25($N_1$) from each other may be twenty-five (25) microns or less. Also, the mirrors 58(1)-58($N_1$) may reflect the writing beams 25(1)-25($N_1$) along parallel or substantially parallel trajectories toward the photoresist 14. As the writing beams 25(1)-25($N_1$) pass through the optical device 34 towards the photoresist 14, the effective pitch may be five (5) microns or less at the photoresist 14 for a reduction ratio of 5:1 for the optical device 34. In one case, the SLM may include a ten (10) micron mirror size which may be associated with a two (2) micron pixel size in the photoresist and sufficient to produce feature sizes, including lines and spaces, of approximately four (4) microns. In this manner, a higher resolution image may be created with more precise control upon the photoresist 14 than without the optical device 34.

Figure 7A:
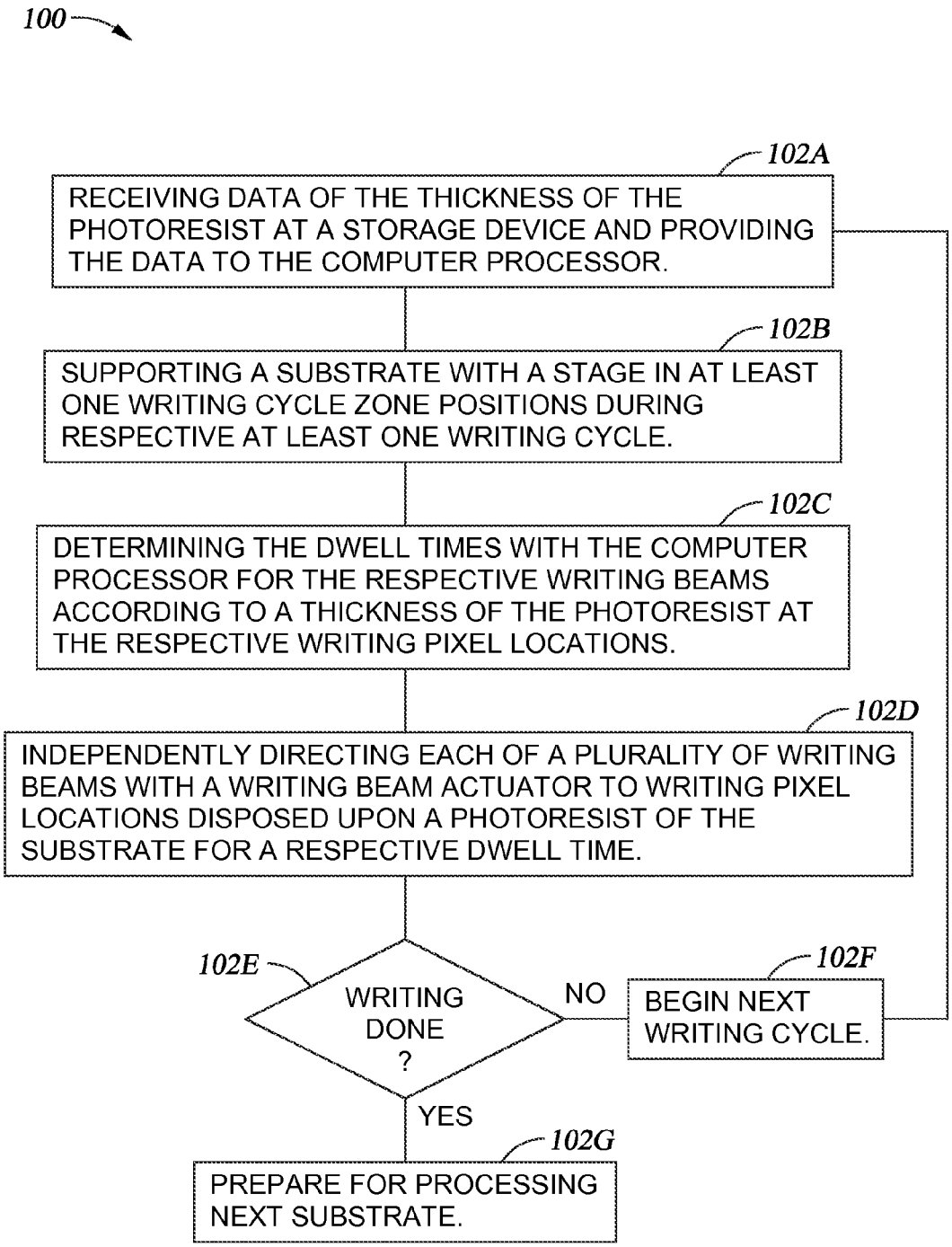
FIG. 7A is a flow chart diagram of an exemplary process of writing a pattern upon a substrate with the multi-beam pattern generator of FIG. 2 to precisely write a pattern by determining dwell times according to photoresist thicknesses.

Now that the components of embodiments of the pattern generator 22 have been discussed, FIG. 7A depicts a flowchart diagram of an exemplary process 100 for writing the pattern 24 with the pattern generator 22 by independently directing each of the writing beams 25(1)-25($N_1$) to the photoresist 14 for a dwell time DT which is adjusted according to the local thickness of the photoresist 14. The process 100 depicted in FIG. 7A will be described using the terminology and information provided above.

The process 100 may include receiving data of the thickness of the photoresist at the storage device 62 and providing the data to the computer processor 32 (operation 102A of FIG. 7A). The data of the thickness TH of the photoresist 14 may be, for example, in a look-up table format based on x- and y-coordinates of positions in the photoresist 14. In this manner, the data of the thickness may be made available for determining the dwell time of each of the writing beams 25(1)-25($N_1$) upon respective ones of the writing pixel locations $WPL_1$-$WPL_{N1}$ within the photoresist 14.

The process 100 may include supporting the substrate 10 with the stage 26 in at least one writing cycle zone location $WCZL_1$-$WCZL_{N2}$ during at least one writing cycle $WC_1$-$WC_{N2}$ (operation 102B of FIG. 7A). The stage 26 and/or the writing mechanism 27 may move relative to each other to dispose each of the writing cycle zone locations $WCZL_1$-$WCZL_{N2}$ relative to the writing beams 25(1)-25($N_1$). In this manner, the pattern 24 may be conveniently located relative to the writing beams 25(1)-25($N_1$) for writing.

The process 100 may include determining the dwell times $DT_1$-$DT_{N1}$ with the computer processor 32 for the respective writing beams 25(1)-25($N_1$) according to the local thickness TH of the photoresist 14 at the respective writing pixel locations $WPL_1$-$WPL_{N1}$ (operation 102C of FIG. 7A). It is noted the adjusting the dwell times $DT_1$-$DT_{N1}$ of the writing beams 25(1)-25($N_1$) may occur at various times relative to the writing cycles $WC_1$-$WC_{N2}$. In one embodiment the dwell times $DT_1$-$DT_{N1}$ may be determined in real time. In another embodiment, the dwell times $DT_1$-$DT_{N1}$ may be determined for a given writing cycle $WC_1$-$WC_{N2}$ during a time period defined with a beginning time to an ending time. The beginning time may be the start of a writing cycle immediately previous to the given writing cycle. The ending time may occur at an end of the given writing cycle. In this manner, the dwell times $DT_1$-$DT_{N1}$ may be timely provided to the writing beam actuator 30.

The process 100 may also include independently directing each of the writing beams 25(1)-25($N_1$) with the writing beam actuator 30 to writing pixel locations $WPL_1$-$WPL_{N1}$ disposed upon the photoresist 14 of the substrate 10 for respective dwell times $DT_1$-$DT_{N1}$ (operation 102D of FIG. 7A). The independently directing each of the writing beams 25(1)-25($N_1$) with the writing beam actuator 30 may comprise independently directing at least one-thousand (1,000) writing beams simultaneously. The independently directing may comprise independently directing each of the mirrors 58(1)-58($N_1$) of the SLM 56. The independently directing may comprise actuating the respective ones of the mirrors 58(1)-58($N_1$) of the SLM 56 to active positions 60A during writing cycles $WC_1$-$WC_{N2}$ when a center axis of respective ones of the writing beams 25(1)-25($N_1$) may be incident within one of the features 64(1)-64($N_2$) of the pattern 24 in the photoresist 14 as determined by the computer processor 32. The independently directing may include providing with the computer processor 32 the respective dwell times $DT_1$-$DT_{N1}$ comprising at least three different values to three of the mirrors 25(1)-25($N_1$) of the SLM 56 during a single one of the writing cycles $WC_1$-$WC_{N2}$. In this manner, the pattern 24 may be precisely written with fewer dimensional errors resulting from variations in the thickness of the photoresist 14.

The process 100 may also include determining whether the writing the pattern 24 is complete (operation 102E of FIG. 7A). If the writing is done then the process 100 may prepare for processing the next substrate 10 (operation 102G of FIG. 6). Otherwise, the next one of the writing cycles $WC_1$-$WC_{N2}$ may begin (operation 102F in FIG. 7A) and the operations 102A-102E may be repeated again. In this manner, the pattern 24 may be completely written by the patter generator 22 and available for processing with a photoresist developer (not shown) compatible with the photoresist 14.

Figure 7B:
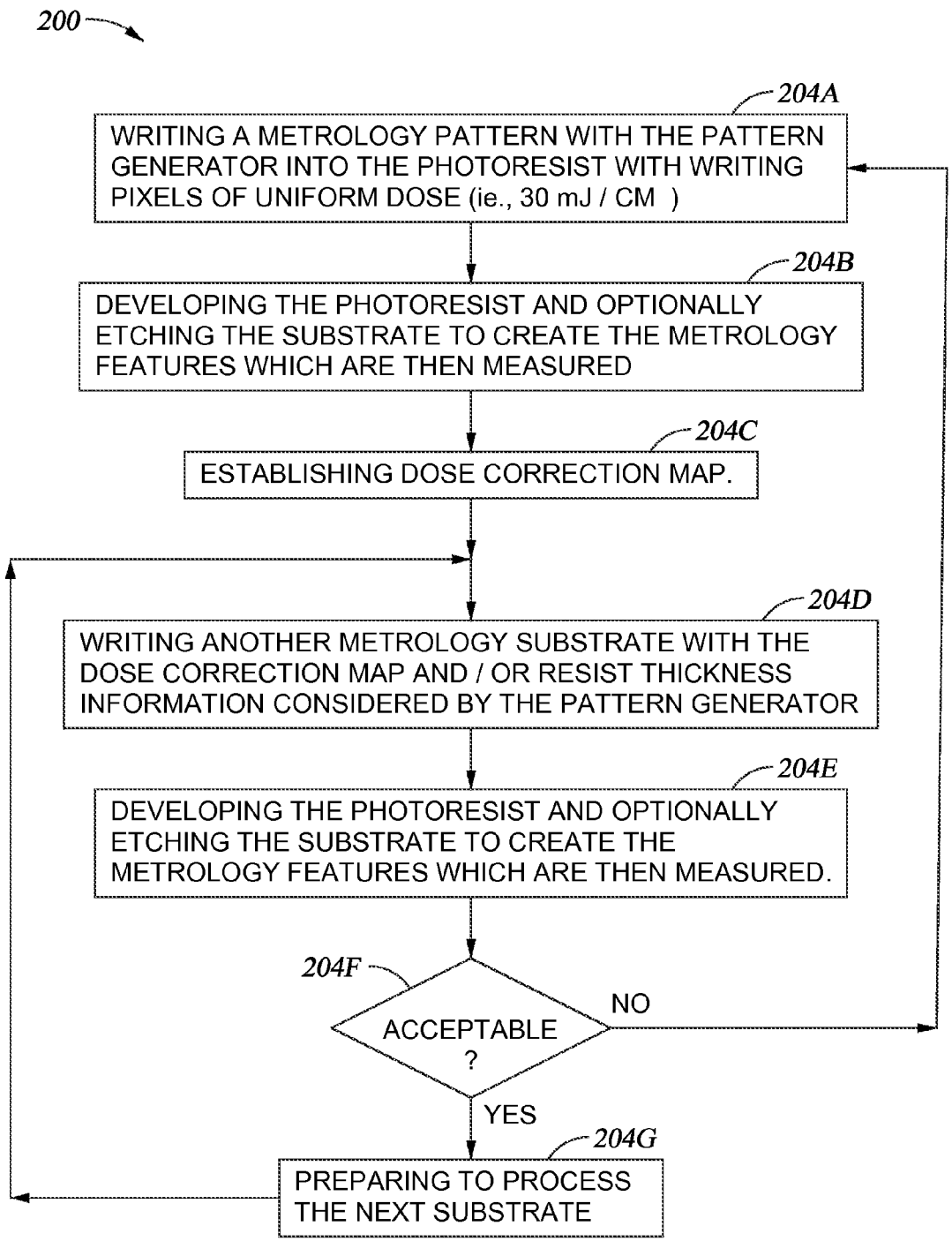
FIG. 7B is a flow chart diagram of an exemplary alternative process of writing the pattern upon the photoresist with the multi-beam pattern generator of FIG. 2, wherein a digital dose correction map incorporating photoresist thicknesses deviations and post-exposure process deviations are utilized to adjust dose delivered at the writing pixels.

FIG. 7B is a flow chart diagram of an exemplary alternative process 200 of writing the pattern 24 upon the photoresist 14 with the multi-beam pattern generator 22 of FIG. 2, wherein a dose correction map 202 incorporating thicknesses deviations of the photoresist 14 and post-exposure process deviations are used to adjust dose delivered by the pattern generator 22 at the writing pixels. The process 200 depicted in FIG. 7B will be described using the terminology and information provided above.

In this regard, the process 200 may include writing a metrology pattern with the pattern generator 22 into the photoresist 14 with writing pixels of uniform dose (operation 204A in FIG. 7B). The metrology pattern may comprise a set of metrology features 205(1)-205(N3) of a same dimension distributed uniformly across a metrology substrate 10A. FIG. 7C is a top view of the exemplary metrology substrate with a metrology pattern 205(X) having a uniform dimension (i.e., a linewidths of five microns forming a cross) written using writing pixels in the photoresist 14 exposed with exemplary uniform doses Q1, for example in this case, the uniform dose Q1 may be thirty (30) milli-Joules per square centimeter. For illustration purposes a metrology feature 205($x$) is depicted as a set of writing pixel doses Q1 exposed in the photoresist 14, and each of the writing pixel doses Q1 comprising the thirty milli-Joules.

The process 200 may also include developing the photoresist and optionally etching the substrate to create the metrology features 205(1)-205(N3) which may be measured (operation 204B in FIG. 7B). FIG. 7D is a top view of the metrology substrate 10A of FIG. 7C depicting exemplary linewidth measurements $W_1$ of the metrology features 205(1)-205(N3) superimposed onto respective locations of the metrology substrate 10. As depicted in FIG. 7D, there may be a range of linewidth measurements W1 from 4.6 microns to 5.6 microns. The range of the linewidth measurements W1 may have several sources of variance, including deviations in the thickness of the photoresist 14. In this manner, a baseline set of linewidth measurements associated with locations upon the substrate and a pixel dose may be created.

The process 200 may also include establishing a dose correction map 202 (operation 204C in FIG. 7B). As shown in FIG. 7E, the dose correction map 202 establishes a relationship between locations on the substrate and a nominal dose to be delivered at writing pixels at these locations to achieve nominal linewidth (see FIG. 1B). In other embodiments of the dose correction map 202, percentage values of nominal doses at the respective locations may also be used instead of nominal dose values. As depicted in FIG. 7E, the dose correction map 202 may include a range of nominal doses from 24 milli-Joules per square centimeter to 34 milli-Joules per square centimeter. The lower nominal doses in the dose correction map 202 may be associated with linewidths depicted in FIG. 7D that are larger than five microns. Also, higher nominal doses in the dose correction map 202 may be associated with linewidths depicted in FIG. 7D that are smaller than five microns. In this manner, the computer processor 32 may use the dose correction map 202 to adjust the nominal dose delivered at writing pixels depending upon their location upon the substrate. In this manner, the dose delivered to the writing pixels may be adjusted by the computer processor 32 to compensate for thickness deviations in the photoresist.

As shown in FIG. 7F, the process 200 may also include writing another metrology substrate 10B with the computer processor 32 adjusting the pixel dose delivered to the locations of the substrate based on the dose correction map 202 (operation 204D in FIG. 7B). The process 200 may also include developing the photoresist and optionally etching the substrate of the other metrology substrate to create the metrology features 205'(1)-205'(N3) which may be measured to determine linewidth measurements (operation 204E in FIG. 7B). In this regard, FIG. 7F is a top view of the other exemplary metrology substrate 10B depicting linewidth measurements of the metrology features of the metrology pattern superimposed onto respective locations of the metrology substrate 10B which has been written using pixel doses based on the dose correction map 202. The range of linewidths measured on the metrology substrate 10B are from a range of 4.9 microns to 5.0 microns. In this manner, the dose correction map 202 may be used by the pattern generator to write a pattern in photoresist on a substrate which, when developed may have improved uniformity.

The process 200 may also include determining whether the linewidths $W_2$ measured are acceptable (operation 204F of FIG. 7B). An exemplary criterion to determine acceptability may be a range of linewidth values or other uniformity measurement, for example all measurements within one-hundred (100) nanometers of a nominal value. If acceptable, the process 200 may include preparing to process the next substrate (operation 204G in FIG. 7B), otherwise if not acceptable, then the process may return to operation 204A in order to establish another dose correction map 202. In this manner, linewidth uniformity may be controlled by adjusting dose to compensate for thickness deviations of photoresist.

Figure 8:
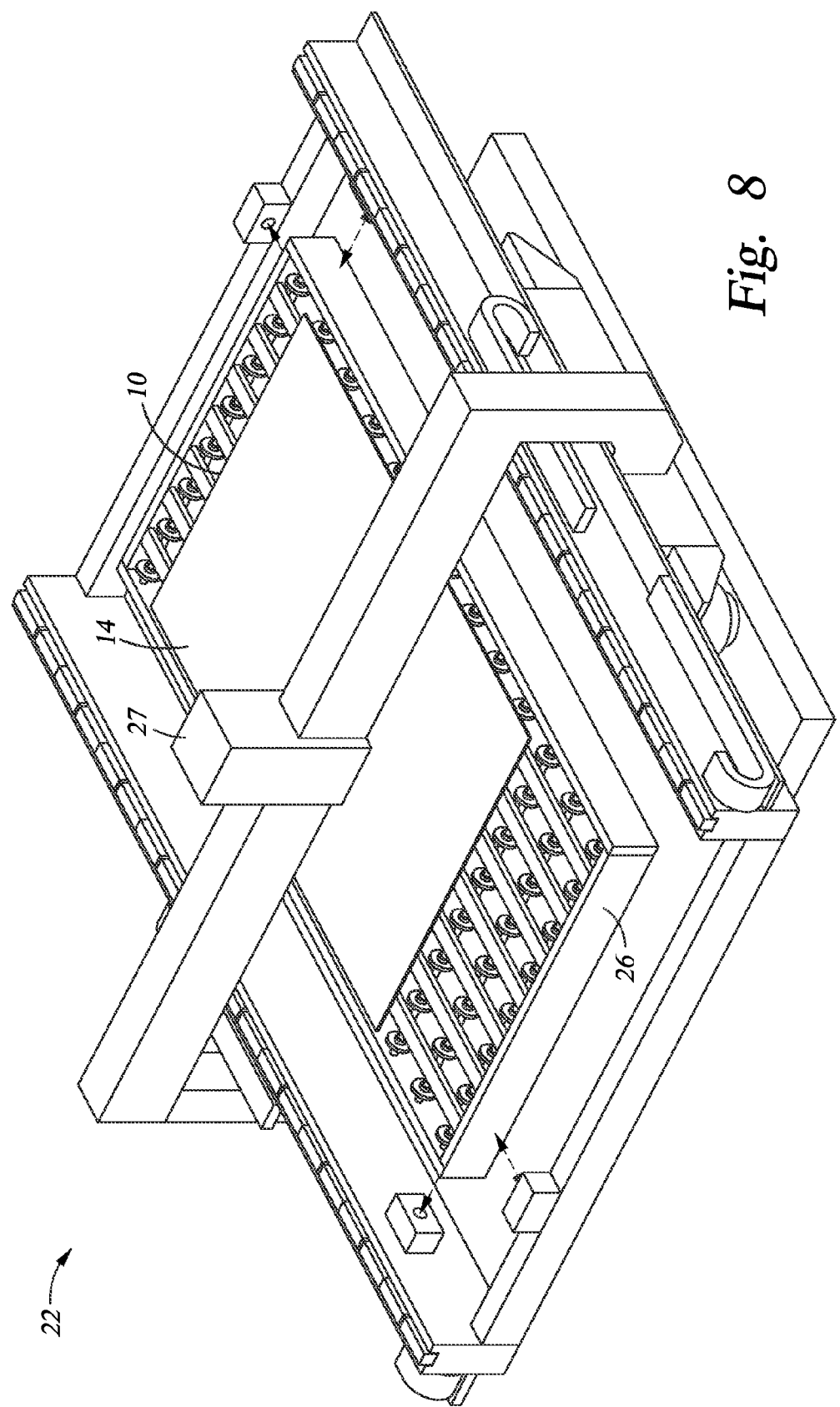
FIG. 8 is a top perspective view of an exemplary embodiment of the multi-beam pattern generator of FIG. 2.

FIG. 8 is a top perspective view of an exemplary embodiment of the multi-beam pattern generator 22 of FIG. 2 showing the writing mechanism 27 mounted relative to the stage 26. The writing mechanism 27 may include the light source 28A, 28B, the writing beam actuator 30, the computer processor 32, and the optical device 34. In this manner, the substrate 10 supported by the stage 26 may move relative to the writing mechanism 27 as the pattern 24 may be written upon the substrate 10 while adjusting for photoresist thickness variation.

Figure 9:
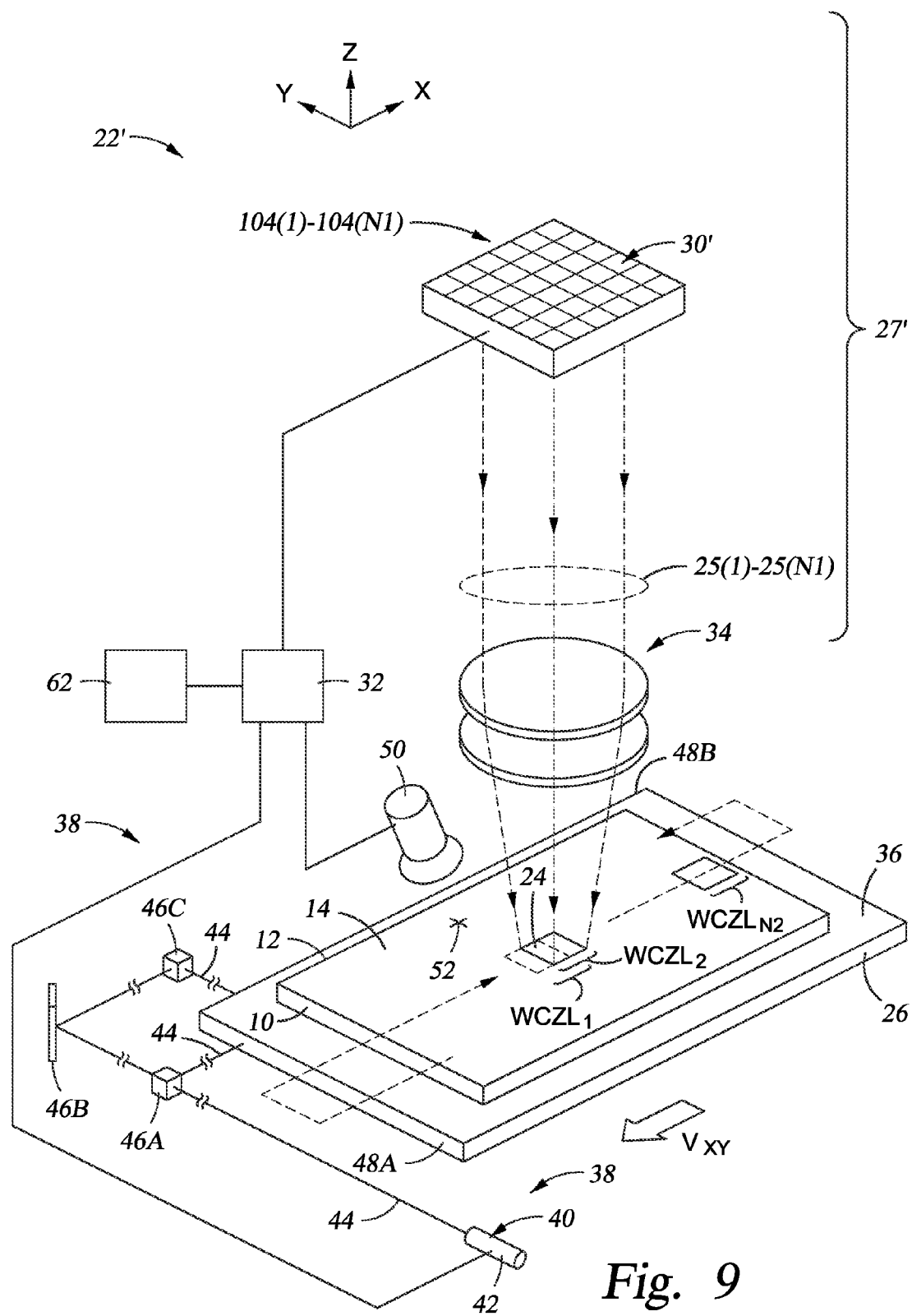
FIG. 9 is a top perspective schematic view of another embodiment of an exemplary multi-beam pattern generator illustrating a different embodiment of a writing beam actuator.

FIG. 9 is a top perspective schematic view of another embodiment of an exemplary multi-beam pattern generator 22'. The pattern generator 22' may be similar to the pattern generator 22 of FIG. 2, thus the differences will primarily be discussed in the interest of clarity and conciseness. The writing beam actuator 30' replaces the writing beam actuator 30 in FIG. 2. In this regard, the writing beam actuator 30' may include a plurality of radiation sources 104(1)-104($N_1$) emitting the writing beams 25'(1)-25'($N_1$). The radiation sources 104(1)-104($N_1$) may comprise laser diodes or vertical-cavity surface emitting lasers ("VCSELs") and the writing beams 25'(1)-25'($N_1$) may comprise laser beams emitted from the radiation sources 104(1)-104($N_1$). The computer processor 32 may determine the dwell time of the writing beams 25'(1)-25'($N_1$) during each writing cycle according to the thickness of the photoresist 14. In this manner, the pattern 24 may be precisely written with precise dimension control.

There are different operating embodiments of the computer processor 32 that provide other approaches to adjust writing dose according to thickness deviations of the photoresist 14. The first operating embodiment was described earlier relative to FIGS. 6A through 6D. Other embodiments are now described relative to FIGS. 10A through 15E.

Figure 10A:
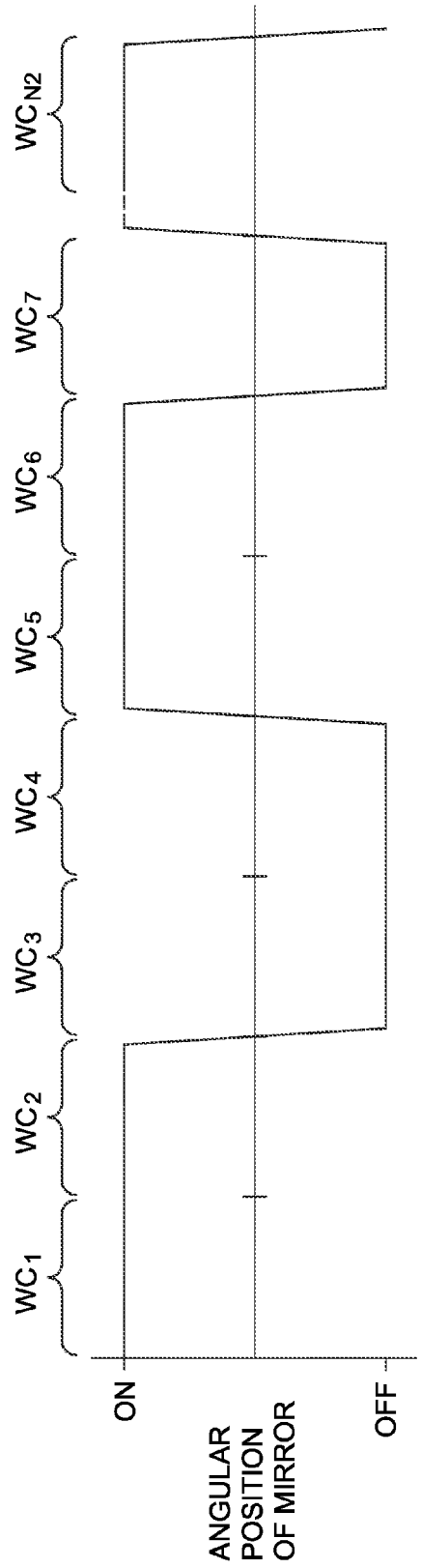
Figure 10B:
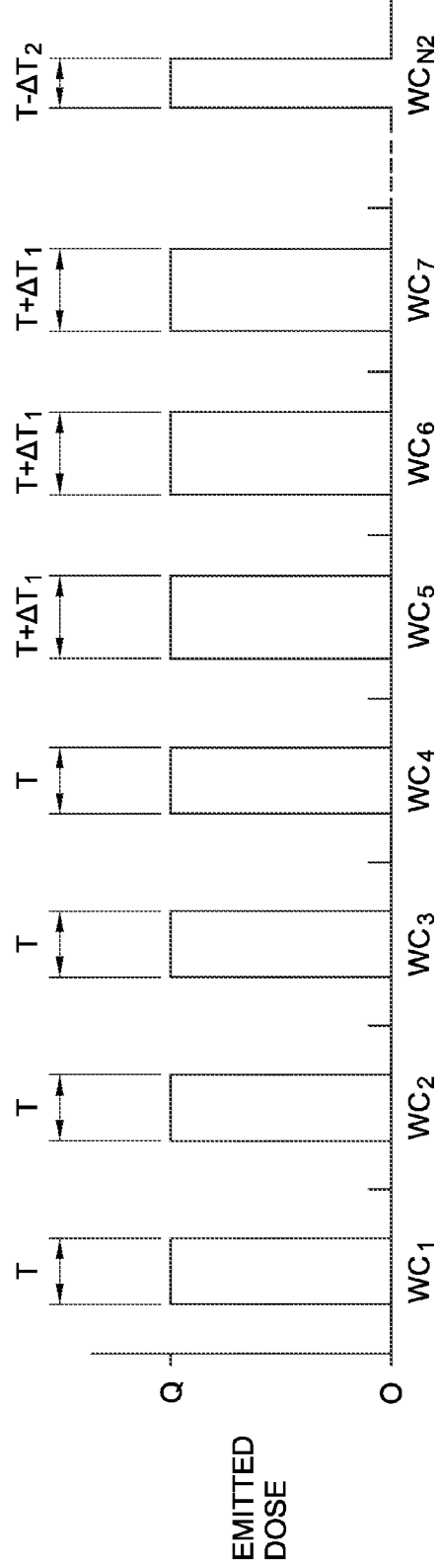

A second operating embodiment of the computer processor 32 is now discussed relative to FIGS. 10A through 10D. This second embodiment is similar to the embodiment illustrated in FIGS. 6A through 6D and so only differences will be discussed for reasons of clarity and conciseness. In this regard, the second embodiment in FIGS. 10A through 10D may involve the computer processor 32 (FIG. 2) being configured to instruct the at least one light sources 28A, 28B to emit light 54 with pulses which are synchronized with a clock cycle of the mirror 58(X2) of the SLM 56. In one case, the clock cycle may enable the mirror 58(X2) to be moved to the actuated 60A position when a pulse of the light 56 is to be reflected by the mirrors 58(X2) to deliver a dose to a writing pixel in the photoresist 14 consistent with the pattern 24. FIG. 10A depicts the mirror 58(X2) in the actuated position 60A during the writing cycles WC1, WC2, WC5, WC6, and $WC_{N2}$ and in the inactive position 60B during writing cycles WC3, WC4, and WC7. However, the duration that the mirror 58(X2) may be in the actuated position 60A during a given writing cycle may be greater than the duration of the pulse of the light 56 that has been synchronized to the respective given writing cycle. In this manner, the duration of the pulse of the light 56 may be used to adjust the dose delivered to the photoresist during a writing cycle as opposed to the duration that the mirror 58(X2) is in the actuated position 60A.

In an illustration of this concept illustrated in FIGS. 10A through 10D, the computer processor 32 (FIG. 2) may instruct: a) pulses of light 56 of duration T to emitted to the mirror 58($X_2$) in writing cycles $WC_1$ and $WC_2$, b) pulses of duration $T+\Delta T_1$ to be emitted in writing cycles WC5 and WC6, and c) a pulse of duration $T-\Delta T_2$ to be emitted during the writing cycle $WC_{N2}$. The higher duration $T+\Delta T_1$ may be associated with a photoresist thickness $TH_1$ which is thicker than the photoresist thickness $TH_0$, and the lower duration $T-\Delta T_2$ may be associated with a photoresist thickness $TH_2$ which is thinner than the photoresist thickness $TH_0$. The duration of the pulse of the light 56 during each of the these writing cycles may be received at the writing pixel during these writing cycles $WC_1$, $WC_2$, $WC_5$, $WC_6$, and $WC_{N2}$ because the pulse duration is synchronized to the actuated position 60A of the mirror 58($X_2$). In this manner, the pixel dose may be adjusted by changing the pulse duration of the light 56 emitted to the SLM 56.

It is noted that in FIG. 10C, no writing pixel dose may be delivered to the photoresist 14 via the mirror 58($X_2$) during the writing cycles $WC_3$, $WC_4$, and $WC_7$ as in this case the mirror 58($X_2$) is in the inactive position 60B ("OFF"). Thus, no compensation for the photoresist thickness may be necessary.

A third operating embodiment of the computer processor 32 is now discussed relative to FIGS. 11A through 11D. This third embodiment is similar to the embodiment illustrated in FIGS. 10A through 10D and so only differences will be discussed for reasons of clarity and conciseness. In this regard, the third embodiment in FIGS. 11A through 11D may involve the computer processor 32 (FIG. 2) being configured to instruct the at least one light sources 28A, 28B to emit light 54 with pulses of light 56 which are synchronized with a clock cycle of the mirror 58($X_2$) of the SLM 56. However, the intensity of the light 56 in the pulses is adjusted to compensate for deviations in photoresist thickness, instead of the duration of the pulses of the light 56.

Figure 11A:
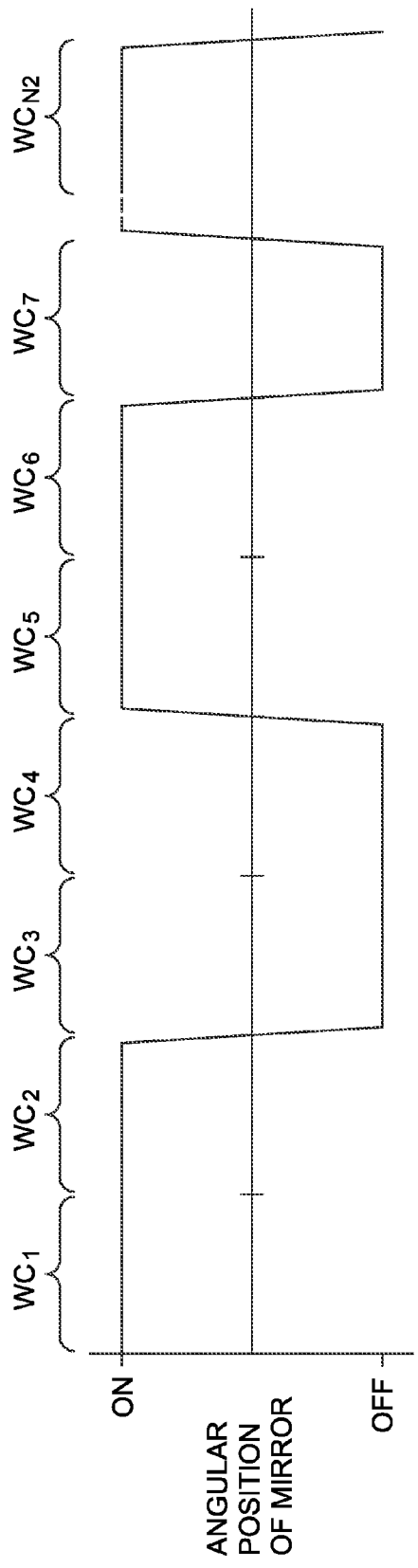
FIGS. 11A through 11D are charts associated with modulating intensities (or emitted dose) of light pulses received by the exemplary mirror of the SLM to adjust for deviations in photoresist thickness, wherein the charts depict, respectively, angular mirror positions, emitted doses to the mirror, reflected doses from the SLM to the photoresist, and photoresist thickness at the writing pixel locations for several writing cycles.
Figure 11B:
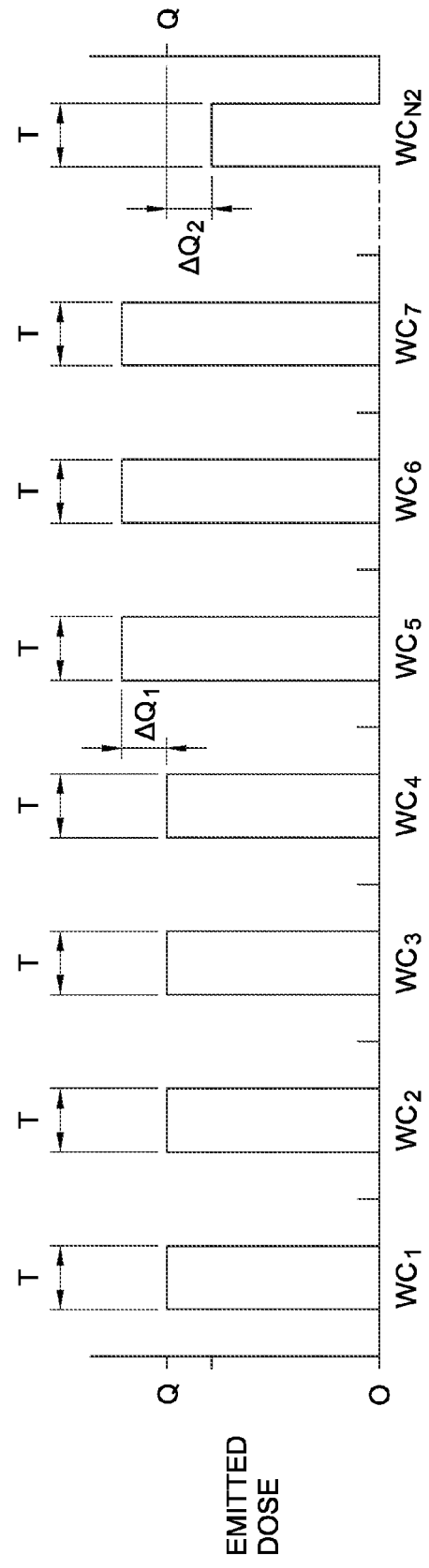
Figure 11C:
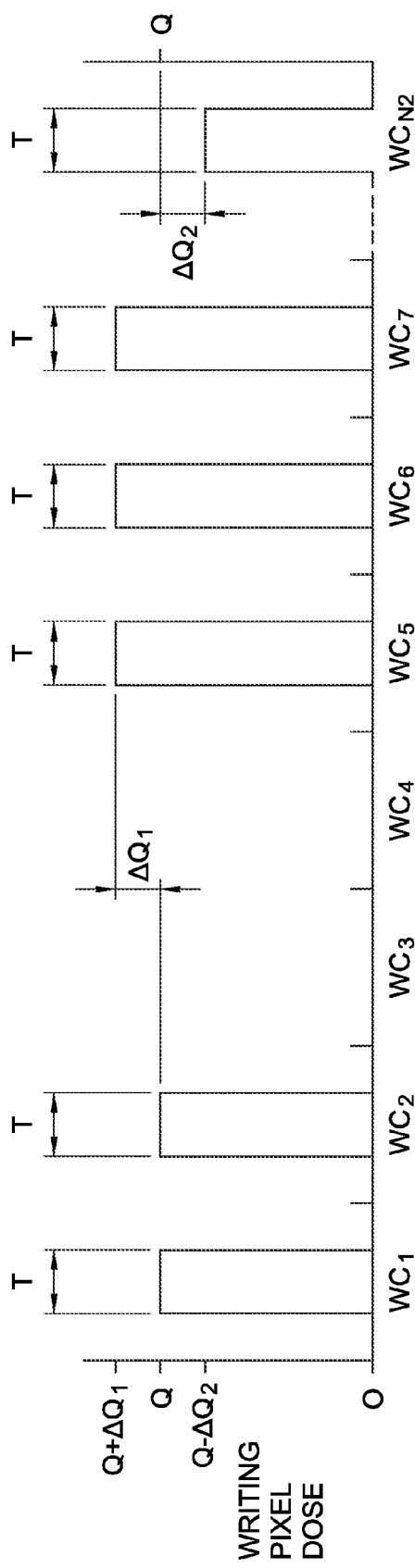
Figure 11D:
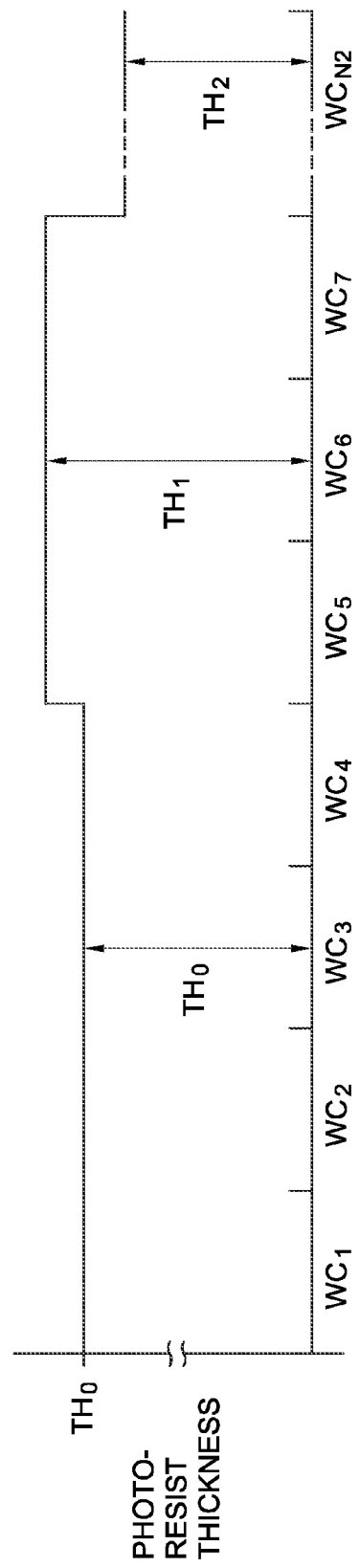

In one case as illustrated in FIG. 11B, during the writing cycles $WC_5$, $WC_6$ the computer processor 32 instructs the light sources to emit increased intensities of the pulses of the light 56. For example, the increase may be an intensity $\Delta Q_1$ from a nominal Q amount emitted in writing cycles $WC_1$, $WC_2$. This increased intensity may compensate for the thicker resist thickness $TH_1$ as shown in FIG. 11D. In writing cycle $WC_{N2}$, the computer processor 32 may instruct the intensity of the pulse of the light 56 to decrease by an intensity $\Delta Q2$ from a nominal Q amount to compensate for the thinner resist thickness $TH_2$. In this manner, changing the intensity of the pulses of the light 56 may be used to compensate for deviations in photoresist thickness to achieve higher uniformity.

A fourth operating embodiment of the computer processor 32 is now discussed relative to FIGS. 12A through 12D. This third embodiment is similar to the embodiment illustrated in FIGS. 10A through 10D and so only differences will be discussed for reasons of clarity and conciseness. In this regard, the fourth embodiment in FIGS. 12A through 12D may involve the computer processor 32 issuing instructions to adjust a frequency of the pulses of the light 56 to compensate for deviations in the photoresist thickness. In this embodiment, the duration of each of the pulses of the light 56 may remain unchanged by the adjustment in the pulse frequency. In this manner, the pixel dose may be adjusted during a respective one of the writing cycles according to pulse frequency.

Figure 12A:
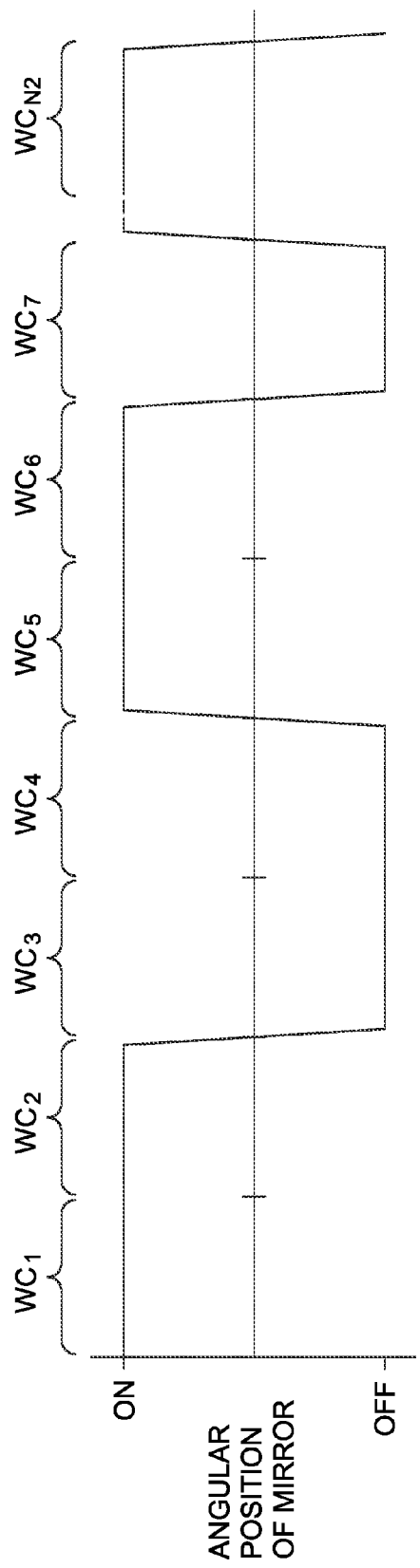
FIGS. 12A through 12D are charts associated with modulating a frequency of emitted doses received by the exemplary mirror of the SLM to adjust for deviations in photoresist thickness, wherein the charts depict, respectively, angular mirror positions, emitted doses to the mirror, reflected doses from the SLM to the photoresist, and photoresist thickness at the writing pixel locations for several writing cycles.
Figure 12B:
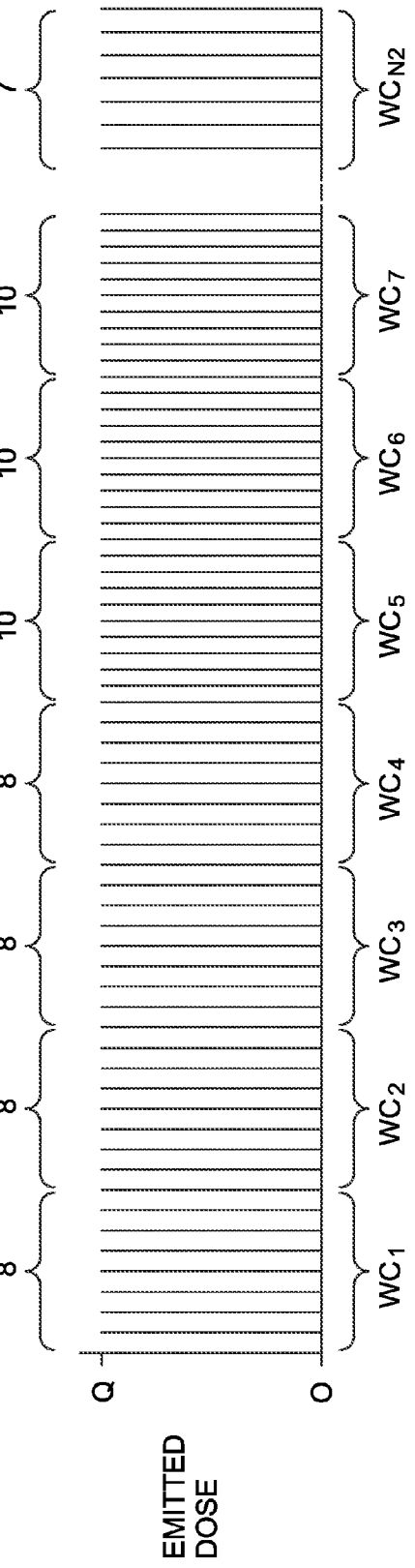
Figure 12C:
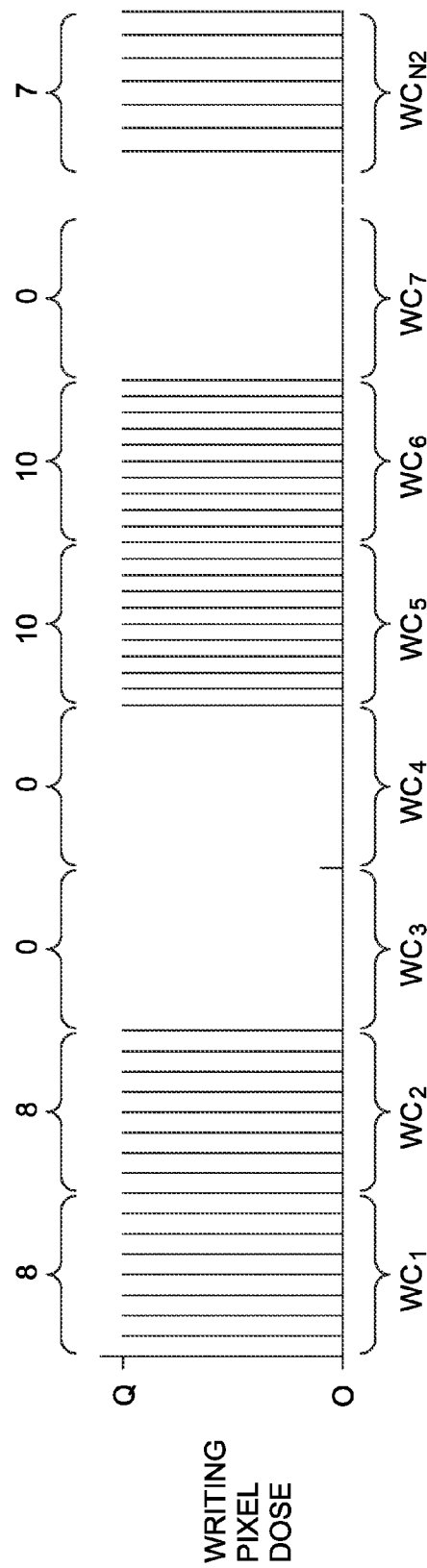
Figure 12D:
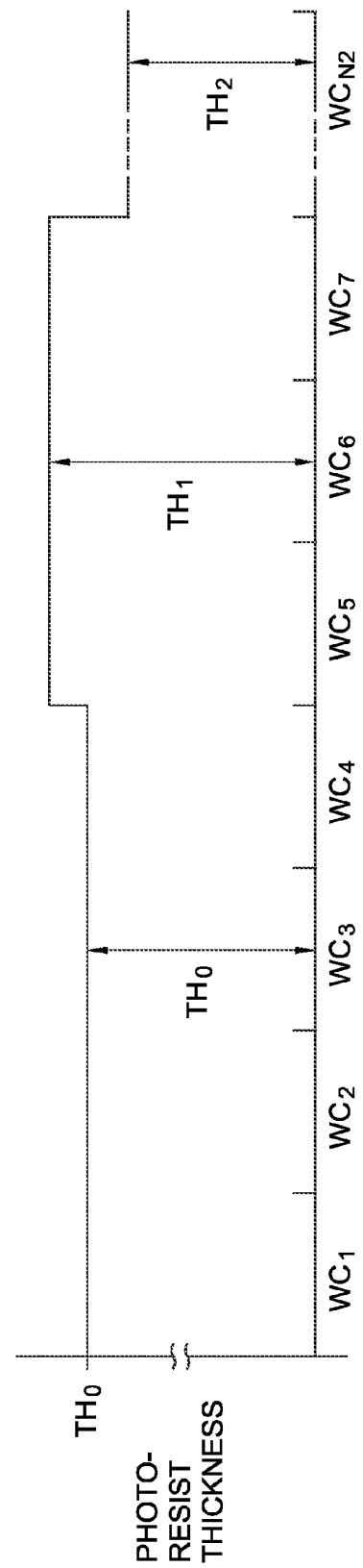

In one case of this embodiment as illustrated in FIG. 12B, during the writing cycles $WC_5$, $WC_6$ the computer processor 32 provides instruction so that the frequency of the pulses of the light 56 may increase to a frequency of ten (10) pulses per writing cycle from the nominal frequency of eight (8) pulses per writing cycles as instructed in writing cycles $WC_1$ through $WC_4$. The higher frequency compensates for the thicker resist thickness $TH_1$ as shown in FIG. 12D. In writing cycle $WC_{N2}$, the computer processor 32 instructs the frequency of the pulse of the light 56 to decrease to seven (7) pulses per writing cycle from a nominal eight (8) pulses to compensate for the thinner resist thickness $TH_2$. In this manner, changing the frequency of the pulses of the light 56 may be used to compensate for deviations in photoresist thickness and achieve higher uniformity. It is understood that a combination of the third and fourth embodiment may also be used.

Figure 13F:
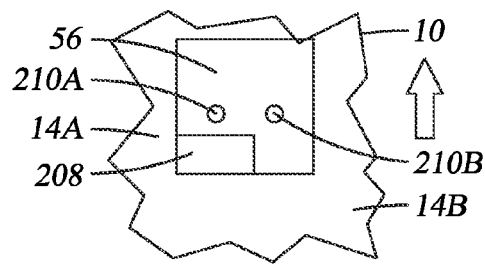
Figure 13F:
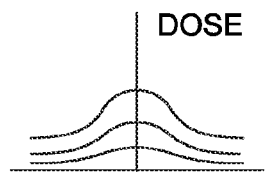
Figure 13F:
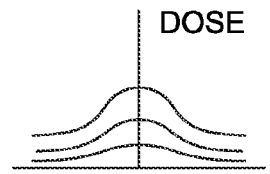
Figure 13F:
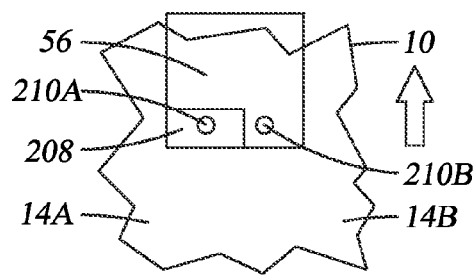
Figure 13F:
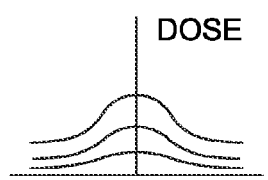
Figure 13F:
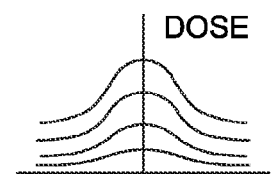
Figure 13F:
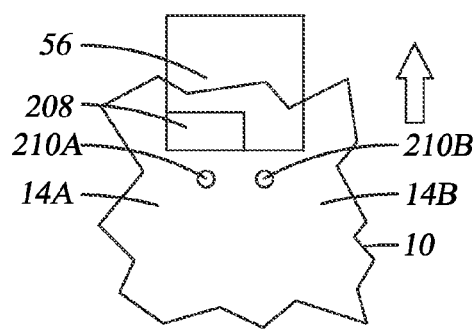

A fifth embodiment is also disclosed. In this regard, a portion 208 of the mirrors 58(1)-58($N_1$) may be turned off adjust a cumulated dose delivered to a pattern feature in order to compensate for deviation thickness of the photoresist. In this regard, FIGS. 13A through 13F are schematic drawings of the SLM 56 superimposed upon the substrate 10 in six (6) respective writing cycle zone locations, respectively. A photoresist section 14A attached to the substrate 10 may include a thickness which is thinner than a thickness of a photoresist section 14B attached to the substrate 10. Accordingly, a dose adjustment may be used to improve uniformity of feature sizes. As depicted in FIG. 13A, a first feature 210A and a second feature 210B of the pattern to be written may be disposed in the photoresist sections 14A, 14B, respectively. As the mirrors 58(1)-58($N_1$) and the substrate 10 move relative to each other cumulative pixel doses are applied to write the first feature 210A and the second feature 210B. The cumulative doses applied to the first feature 210A in the writing cycles of FIG. 13A through FIG. 13E are depicted in FIGS. 14A through 14E, respectively. The cumulative doses applied to the second feature 210B in the writing cycles of FIG. 13A through FIG. 13E are shown in FIGS. 15A through 15E, respectively. The portion 208 of the mirrors 58(1)-58($N_1$) are available to provide a dose to the first feature 210A as shown in FIG. 13E, but since the mirrors in the portion 208 are turned off (in the inactive position 60B), no dose is contributed to the first feature 210A. In this manner, the computer processor 32 may instruct different portions of the mirrors to be turned off to adjust pixel dose according to thickness of the photoresist. An advantage to this embodiment may be that the pixel dose may be precisely adjusted by implementing the size and location of the portion 208 to account for deviations in resist thickness.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:
1. A multi-beam pattern generator, comprising:
   a stage configured to support a first substrate in a plurality of writing cycle zone locations during respective ones of a plurality of writing cycles;
   a writing beam actuator configured to independently direct each of a plurality of writing beams to a plurality of writing pixel locations disposed upon an outer surface of a photoresist disposed on the first substrate; and a computer processor configured to:
> determine a thickness of the photoresist at each of the writing pixel locations, wherein each thickness is measured between the first substrate and the outer surface of the photoresist before exposing the photoresist to the plurality of writing beams,
> determine post-exposure process deviations at corresponding writing pixel locations on a first metrology substrate after exposing the first metrology substrate to uniform writing doses from the plurality of writing beams at each of the corresponding writing pixel locations,
> apply a plurality of correction doses at corresponding writing pixel locations on a second metrology substrate, wherein the plurality of correction doses is determined based on the determined post-exposure process deviations for the first metrology substrate,
> determine the plurality of correction doses applied to the second metrology substrate are acceptable for processing additional substrates including the first substrate, and
> adjust a delivered writing dose from the plurality of writing beams to the respective writing pixel locations on the first substrate according to variations of the thickness of the photoresist between the respective writing pixel locations on the first substrate, and according to the plurality of correction doses that are applied to the second metrology substrate.

2. The multi-beam pattern generator of claim 1, wherein the writing beam actuator comprises a spatial light modulator (SLM) comprising mirrors.

3. The multi-beam pattern generator of claim 2, further comprising a light source, wherein mirrors of the SLM are configured to be digitally controlled independently of each other from an inactive position to an active position for respective dwell times during a respective one of the plurality of writing cycles to reflect light emitted from the light source upon the photoresist.

4. The multi-beam pattern generator of claim 1, further comprising a storage device, wherein the computer processor is configured to adjust the delivered writing dose based on data of the thickness of the photoresist retrieved from the storage device.

5. The multi-beam pattern generator of claim 1, wherein the computer processor is configured to adjust the delivered writing dose by instructing a radiation source for the writing beam actuator to emit radiation pulses having a pulse duration adjusted according to the thickness of the photoresist at the respective writing pixel locations.

6. The multi-beam pattern generator of claim 1, wherein the computer processor is configured to adjust the delivered writing dose by instructing a radiation source for the writing beam actuator to emit radiation pulses having a pulse frequency adjusted according to the thickness of the photoresist at the respective writing pixel locations.

7. The multi-beam pattern generator of claim 1, wherein the computer processor is configured to adjust the delivered writing dose according to the thickness of the photoresist at a portion of the first substrate by instructing the writing beam actuator to turn off a portion of the writing beams according to the thickness of the photoresist at the respective writing pixel locations.

8. The multi-beam pattern generator of claim 1, wherein the computer processor is configured to adjust the delivered writing dose according to a dose correction map.

9. The multi-beam pattern generator of claim 1, wherein the computer processor is configured to adjust the delivered writing dose by instructing a radiation source for the writing beam actuator to emit radiation pulses having an intensity adjusted according to the thickness of the photoresist at the respective writing pixel locations.

10. A method of writing a pattern with a multi-beam pattern generator, comprising:
> supporting a first substrate with a stage in a plurality of writing cycle zone locations during respective ones of a plurality of writing cycles;
> instructing, with a computer processor, a writing beam actuator to independently direct a plurality of writing beams to a plurality of writing pixel locations disposed upon an outer surface of a photoresist disposed on the first substrate;
> determining a thickness of the photoresist at each of the writing pixel locations, wherein each thickness is measured between the first substrate and the outer surface of the photoresist before exposing the photoresist to the plurality of writing beams;
> determining post-exposure process deviations at corresponding writing pixel locations on a first metrology substrate after exposing the first metrology substrate to uniform writing doses from the plurality of writing beams at each of the corresponding writing pixel locations;
> applying a plurality of correction doses at corresponding writing pixel locations on a second metrology substrate, wherein the plurality of correction doses is determined based on the determined post-exposure process deviations for the first metrology substrate;
> determining the plurality of correction doses applied to the second metrology substrate are acceptable for processing additional substrates including the first substrate; and
> adjusting a writing pixel dose delivered from the plurality of writing beams to the respective writing pixel locations on the first substrate according to variations of the thickness of the photoresist between the respective writing pixel locations on the first substrate, and according to and according to the plurality of correction doses that are applied to the second metrology substrate.

11. The method of claim 10, wherein the adjusting the writing pixel dose comprises instructing a radiation source for the writing beam actuator to emit radiation pulses having a pulse duration adjusted according to the thickness of the photoresist at the respective writing pixel locations.

12. The method of claim 10, wherein the adjusting the writing pixel dose comprises instructing a radiation source for the writing beam actuator to emit radiation pulses having a pulse frequency adjusted according to the thickness of the photoresist at the respective writing pixel locations.

13. The method of claim 10, wherein the adjusting the writing pixel dose comprises instructing the writing beam actuator to turn off a portion of the writing beams during at least one of the plurality of writing cycles according to the thickness of the photoresist.

14. The method of claim 10, wherein the adjusting the writing pixel dose comprises receiving writing pixel dose data from a dose correction map based on an identification of a respective one of the plurality of writing cycle zone locations.

15. The method of claim 10, wherein the adjusting the writing pixel dose comprises instructing a radiation source for the writing beam actuator to emit radiation pulses having an intensity adjusted according to the thickness of the photoresist at the respective writing pixel locations.

\* \* \* \* \*